(12) United States Patent
Liu et al.

(10) Patent No.: US 6,754,261 B1
(45) Date of Patent: Jun. 22, 2004

(54) SYSTEM, DEVICE, AND METHOD FOR DETERMINING THE SAMPLING TIME FOR A TIME-DOMAIN EQUALIZER

(75) Inventors: Qingli Liu, North Potomac, MD (US); Aleksandar Purkovic, Potomac, MD (US)

(73) Assignee: Nortel Networks Limited (CA)

( * ) Notice: Subject to any disclaimer, the term of this patent is extended or adjusted under 35 U.S.C. 154(b) by 0 days.

(21) Appl. No.: 09/542,229

(22) Filed: Apr. 4, 2000

(51) Int. Cl.[7] .............................. H03H 7/30; H03H 7/40; H03K 5/159

(52) U.S. Cl. ...................... 375/232; 375/231; 375/350; 375/340; 375/344

(58) Field of Search .................................. 375/229, 230, 375/231, 232, 260, 340, 350, 344, 355; 708/300, 322, 323; 455/59, 63, 296

(56) References Cited

U.S. PATENT DOCUMENTS 6,028,891 A * 2/2000 Ribner et al. ............... 375/222
6,353,644 B1 * 3/2002 Cai et al. ..................... 375/350
6,421,380 B1 * 7/2002 Gu et al. ..................... 375/232

* cited by examiner

Primary Examiner—Betsy L. Deppe
(74) Attorney, Agent, or Firm—Steubing McGuiness & Manaras LLP

(57) ABSTRACT

A system, device, and method for determining the sampling time for a time-domain equalizer divides an over-sampled sequence into a plurality of individual Nyquist rate sequences, determines time-domain equalizer coefficients using one of the individual Nyquist rate sequences, and measures the performance for all individual Nyquist rate sequences using the time-domain equalizer coefficients. The Nyquist rate sequence having the best performance is selected, and the sampling time (delay) is configured so that the selected Nyquist rate sequence is provided to the time-domain equalizer.

6 Claims, 19 Drawing Sheets

SYSTEM, DEVICE, AND METHOD FOR DETERMINING THE SAMPLING TIME FOR A TIME-DOMAIN EQUALIZER

CROSS-REFERENCE TO RELATED APPLICATIONS

The present application may be related to the following commonly-owned United States patent applications, which are hereby incorporated herein by reference in their entireties:

U.S. patent application Ser. No. 09/542,212 entitled SYSTEM, DEVICE, AND METHOD FOR TIME-DOMAIN EQUALIZER TRAINING USING AN AUTO-REGRESSIVE MOVING AVERAGE MODEL, filed on even date herewith in the names of Qingli Liu and Aleksandar Purkovic;

U.S. patent application Ser. No. 09/542,366 entitled SYSTEM, DEVICE, AND METHOD FOR TIME-DOMAIN EQUALIZER TRAINING USING INJECTED OUT-OF-BAND NOISE, filed on even date herewith in the names of Aleksandar Purkovic and Qingli Liu;

U.S. patent application Ser. No. 09/542,222 entitled SYSTEM, DEVICE, AND METHOD FOR TIME-DOMAIN EQUALIZER TRAINING USING A TWO-PASS AUTO-REGRESSIVE MOVING AVERAGE MODEL, filed on even date herewith in the names of Aleksandar Purkovic and Steven A. Tretter.

FIELD OF THE INVENTION

The present invention relates generally to communication systems, and more particularly to time-domain equalization of a communication channel.

BACKGROUND OF THE INVENTION

FIG. 1 shows a typical communication system 100 having a local/central unit 102 in communication with a remote unit 106 over a communication medium 104. Generally speaking, the communication medium 104 supports bi-directional communications between the local/central unit 102 and the remote unit 106. For convenience, communications from the local/central unit 102 to the remote unit 106 are said to be "downstream" communications, while communications from the remote unit 106 to the local/central unit 102 are said to be "upstream" communications. Thus, the communication medium 104 typically supports a downstream channel over which the local/central unit 102 communicates to the remote unit 106 and an upstream channel over which the remote unit 106 communicates to the local/central unit 102. The upstream channel and the downstream channel may share the same physical communication link or occupy different physical communication links. When the upstream channel and the downstream channel share the same physical communication link, the upstream channel and the downstream channel may occupy the same frequency band (e.g., analog modem channels) or different, typically non-overlapping, frequency bands (e.g., ADSL or cable modem channels). The upstream and downstream channels may be symmetric or asymmetric.

Within the communication system 100, it is common for the upstream and downstream communication channels to have dispersive characteristics. Specifically, each channel has a particular impulse response that disperses signals carried over the channel by extending the effects of each signal over a period of time. In many cases, the dispersive nature of the channel causes various distortions of the signals carried over the channel, such as Inter-Symbol Interference (ISI), Inter-Carrier Interference (ICI), and other distortions.

FIG. 2A shows a representation of an exemplary transmit signal 210 that is transmitted over a dispersive channel, for example, by the local/central unit 102. The exemplary transmit signal 210 includes two symbols, $S_1$ (211) and $S_2$ (212), that are transmitted over the dispersive channel with no inter-symbol delay. FIG. 2B shows a representation of an exemplary receive signal 220 that is received over the dispersive channel, for example, by the remote unit 106, when the symbols $S_1$ (211) and $S_2$ (212) are transmitted over the dispersive channel with no inter-symbol delay. As shown in FIG. 2B, the transmitted symbol $S_1$ (211) is dispersed by the dispersive channel such that the received symbol $R_1$ (221) overlaps the beginning of the symbol $S_2$ (212). This causes ISI between the symbols $S_1$ (211) and $S_2$ (212) and therefore corruption of the symbol $S_2$ (212).

One way to avoid or reduce ISI is to add a sufficient amount of inter-symbol delay to the transmitted symbols so that the received symbols do not overlap.

FIG. 3A shows a representation of an exemplary transmit signal 310 that is transmitted over a dispersive channel, for example, by the local/central unit 102. The exemplary transmit signal 310 includes two symbols, $S_1$ (311) and $S_2$ (312), that are transmitted over the dispersive channel with inter-symbol delay.

FIG. 3B shows a representation of an exemplary receive signal 320 that is received over the dispersive channel, for example, by the remote unit 106, when the symbols $S_1$ (311) and $S_2$ (312) are transmitted over the dispersive channel with inter-symbol delay. As shown in FIG. 3B, the transmitted symbols $S_1$ (311) and $S_2$ (312) are dispersed by the dispersive channel. However, because of the inter-symbol delay in the transmitted signal, the received symbols $R_1$ (321) and $R_2$ (322) do not overlap. As a result, there is no ISI between the symbols $S_1$ (311) and $S_2$ (312).

While the inter-symbol delay added to the transmitted signal eliminates (or at least reduces) ISI, there are detriments to employing such inter-symbol delay. For one, the inter-symbol delay reduces the efficiency of the transmitted signal in that fewer symbols (and therefore less data) are transmitted over a particular period of time. Also, the inter-symbol delay can cause cross-talk between channels carried over a common physical communication link. Thus, inter-symbol delay may be impractical for certain applications.

Another way to avoid or reduce ISI is to "shorten" the impulse response of the channel. This is typically done using a time-domain equalizer (TEQ) at the receiving end of the communication channel. The TEQ is a short Finite Impulse Response (FIR) filter that is used to time-compress (shorten) the impulse response of the communication channel. In addition to shortening the impulse response of the channel, the TEQ also tends to "flatten" the channel and amplify noise. The effectiveness of the TEQ has a direct impact on overall performance, and therefore the TEQ design and the TEQ coefficients must be carefully determined. There are typically different design considerations for time-domain equalization of the upstream and downstream channels. Also, whether the implementation platform is memory or processing power limited (or both) plays an important role in the TEQ design.

The following references are hereby incorporated herein by reference in their entireties, and may be referenced throughout the specification using the corresponding reference number. It should be noted that the reference numbers are not consecutive.

[1] John A. C. Bingham, *ADSL, VDSL and Multicarrier Moditlation*, John Wiley & Sons, 2000.

[2] J. S. Chow, J. M. Cioffi, and J. A. C. Bingham "Equalizer Training Algorithms for Multicarrier Modulation Systems," ICC 1993, May 1993, pp. 761–765.

[3] D. D. Falconer and F. R. Magee, Jr., "Adaptive Channel Memory Truncation for maximum Likelihood Sequence Estimator," *B.S.T.J.* Nov. 1973, pp. 1541–1562.

[5] D. T. Lee, B. Friedlander, and M. Morf, "Recursive Ladder Algorithms for ARMA Modeling," *IEEE Trans. Automat. Contr.*, vol. AC-27, No. 4, August 1982.

[6] P. J. W. Melsa, R. C. Younce, and C. E. Rohrs, "Impulse Response Shortening for Discrete Multitone Transceivers," *IEEE Trans. Commun.*, vol. 44, No. 12, pp. 1662–1672, December 1996.

[7] N. Al-Dhahir, A. H. Sayed, and J. M. Cioffi, "Stable pole-zero modeling of long FIR filters with application to the MMSE-DFE," *IEEE Trans. Commun.*, vol. 45, No. 5, pp. 508–513, 1997.

[8] N. Al-Dhahir, A. H. Sayed, and J. M. Cioffi, "A high-performance cost-effective pole-zero MMSE-DFE," *Proc. Allerton Conf. Commun., Contr., Computing*, September 1993, pp. 1166–1175.

[10] Steven M. Kay, *Modern Spectral Estimation: Theory and Application*, Prentice Hall, 1988.

[11] Peter E. Caines, *Linear Stochastic Systems*, John Wiley & Sons, 1988.

[13] N. Al-Dhahir and J. M. Cioffi, "A low complexity pole-zero MMSE Equalizer for ML Receivers," *Proc. Allerton Conf. Commun., Control, Comput.*, pp. 623–632, 1994.

SUMMARY OF THE INVENTION

In accordance with one aspect of the invention, the sampling time for a time-domain equalizer is determines by dividing an over-sampled sequence into a plurality of individual Nyquist rate sequences, determining time-domain equalizer coefficients using one of the individual Nyquist rate sequences, and measuring the performance for all individual Nyquist rate sequences using the time-domain equalizer coefficients. The Nyquist rate sequence having the best performance is selected, and the sampling time (delay) is configured so that the selected Nyquist rate sequence is provided to the time-domain equalizer.

BRIEF DESCRIPTION OF THE DRAWINGS

The foregoing and other objects and advantages of the invention will be appreciated more fully from the following further description thereof with reference to the accompanying drawings, wherein.

DETAILED DESCRIPTION OF A PREFERRED EMBODIMENT

Figure 1:
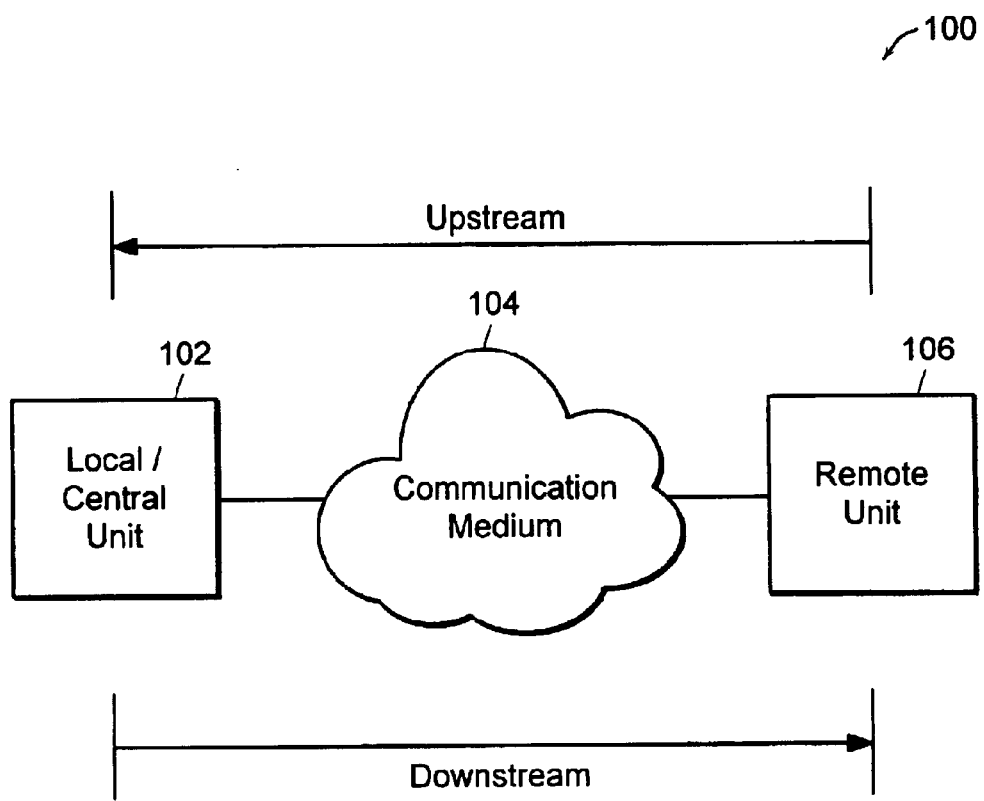
FIG. 1 is a network diagram showing an exemplary communication system having a local/central unit in communication with a remote unit over a communication medium.
Figure 2A:
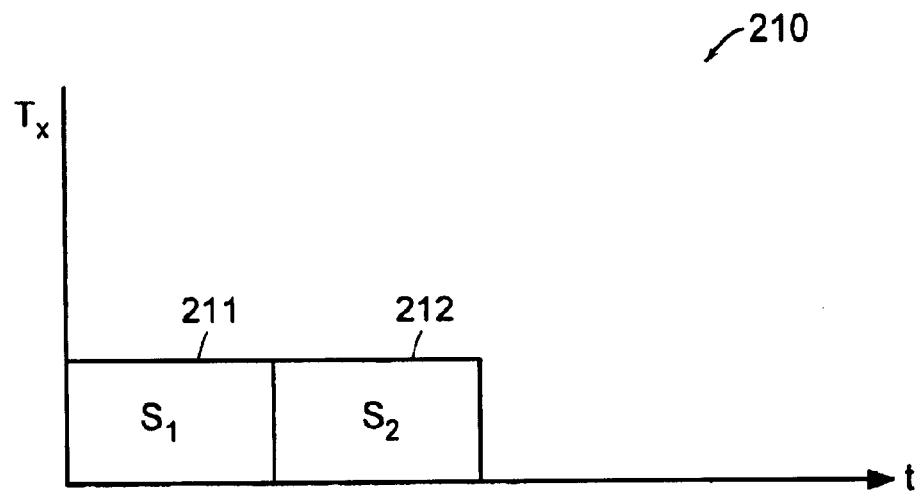
FIG. 2A is a representation of an exemplary transmit signal having two symbols that are transmitted over a dispersive channel with no inter-symbol delay.
Figure 2B:
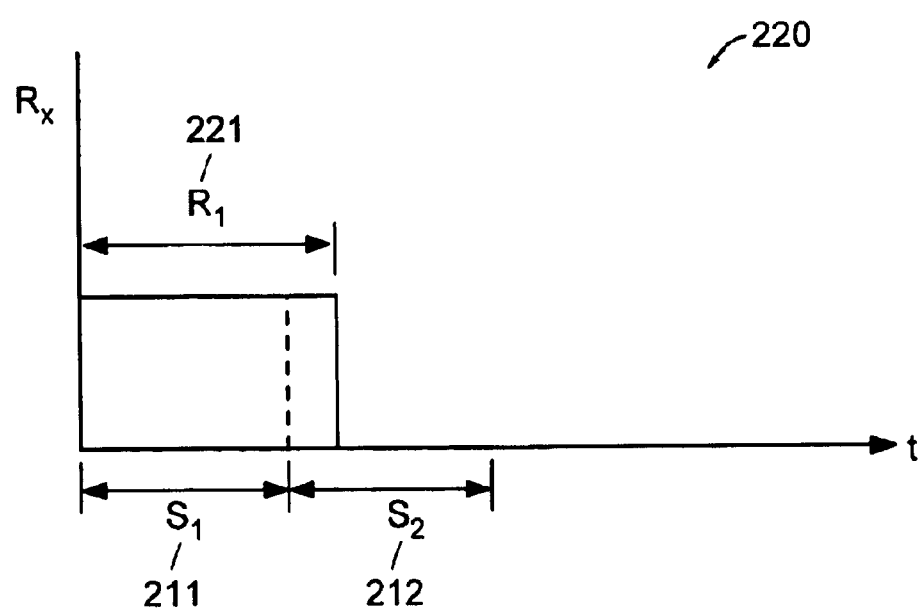
FIG. 2B is a representation of an exemplary receive signal that is received over a dispersive channel when symbols are transmitted over the dispersive channel with no inter-symbol delay.
Figure 3A:
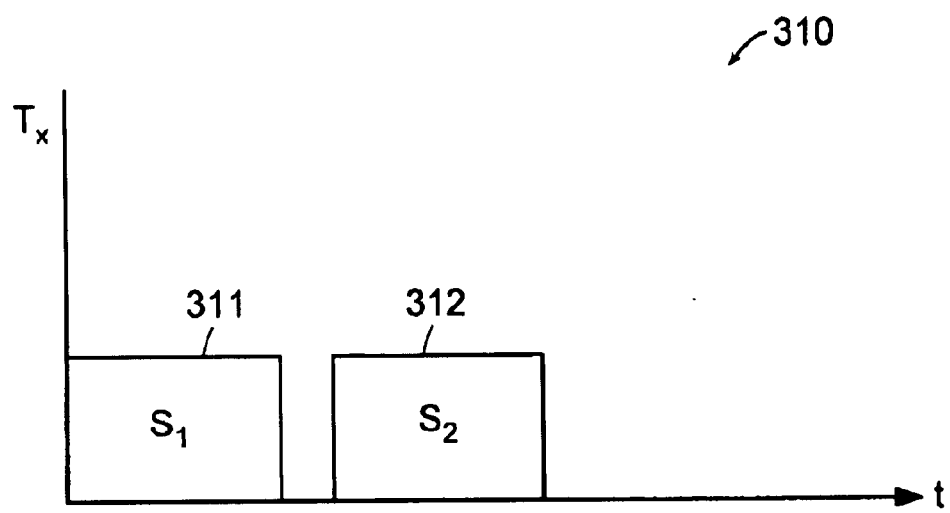
FIG. 3A is a representation of an exemplary transmit signal having two symbols that are transmitted over a dispersive channel with inter-symbol delay.
Figure 3B:
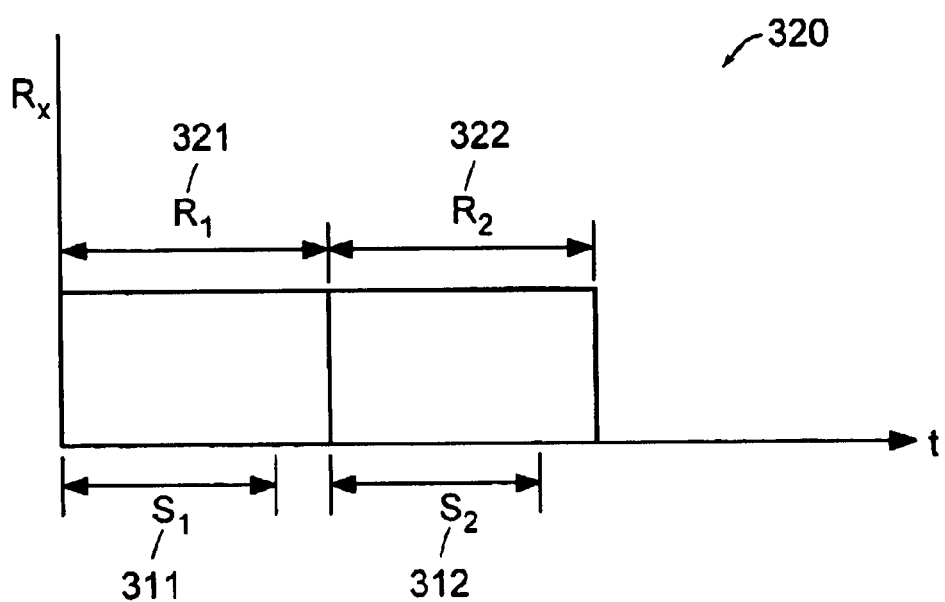
FIG. 3B is a representation of an exemplary receive signal that is received over a dispersive channel when symbols are transmitted over the dispersive channel with inter-symbol delay.

An embodiment of the present invention determines the sampling time for a time-domain equalizer by dividing an over-sampled sequence into a plurality of individual Nyquist rate sequences, determining time-domain equalizer coefficients using one of the individual Nyquist rate sequences, and measuring the performance for all individual Nyquist rate sequences using the time-domain equalizer coefficients. The Nyquist rate sequence having the best performance is selected, and the sampling time (delay) is configured so that the selected Nyquist rate sequence is provided to the time-domain equalizer.

Various TEQ design considerations are discussed herein with reference to an exemplary communication system that is generally known as Asymmetric Digital Subscriber Line (ADSL). However, it should be noted that ADSL is simply an exemplary embodiment, and many of the TEQ design considerations are applicable in other networking environments.

An ADSL communication system provides high-speed digital communications between a telephone company central office and a subscriber site (e.g., a customer home or business) over existing twisted-pair copper telephone wires (i.e., the analog local loop, which is referred to in ADSL parlance as the "subscriber loop"). More specifically, the ADSL communication system provides high-speed digital communications between a central ADSL terminal unit (ATU-C) at the telephone company central office and a remote ADSL terminal unit (ATU-R) at the subscriber site that communicate over the subscriber loop. The communication channel from the ATU-C to the ATU-R is considered to be the downstream channel, while the communication channel from the ATU-R to the ATU-C is considered to be the upstream channel. The upstream and downstream channels usually occupy non-overlapping frequency bands on the subscriber loop, with the upstream channel at a lower frequency band than the downstream channel. The downstream channel provides more communication bandwidth than the upstream channel, and therefore downstream communications are faster than upstream communications.

Discrete Multitone (DMT) has been adopted as the modulation of choice in several ADSL standards. DMT was adopted first by ANSI (T1.413 standard) and then by the ITU-T (G. 992.1 and G. 992.2, formerly G.dmt and G.lite, respectively) for high-speed data transmission over twisted-pair copper wire. In DMT-based transmission, the available signal bandwidth in either the upstream or the downstream direction is divided into multiple parallel orthogonal subchannels. The information bit stream is broken into multiple groups, with each group used to select a quadrature-amplitude-modulation (QAM) constellation point, which in turn modulates a subcarrier in the specific subchannel. One of the key design considerations for a DMT modem is the use of the Inverse Discrete Fourier Transform (IDFT) to modulate the DMT signal and the Discrete Fourier Transform (DFT) to demodulate the DMT signal. The use of DFT/IDFT requires that orthogonality between the subchannels be maintained at the receiver. The DFT and IDFT are effectively performed by using the Fast Fourier Transform (FFT) and Inverse FFT (IFFT), respectively.

Efficient equalization of such subscriber loops can be carried out in the frequency domain by using a single-tap complex equalizer for each subchannel, but only if orthogonality between subchannels is maintained. This means there can be neither inter-carrier interference (ICI) nor inter-symbol interference (ISI) in the DMT signal. Also, in order to use DFF to perform demodulation, the received signal must appear periodic within a block of samples. The approach used in the DMT transceiver to accomplish this periodicity is to prefix a block of samples corresponding to a DMT symbol, with the last v samples of the same block. The name used for these particular v samples is the cyclic prefix (CP).

Figure 4:
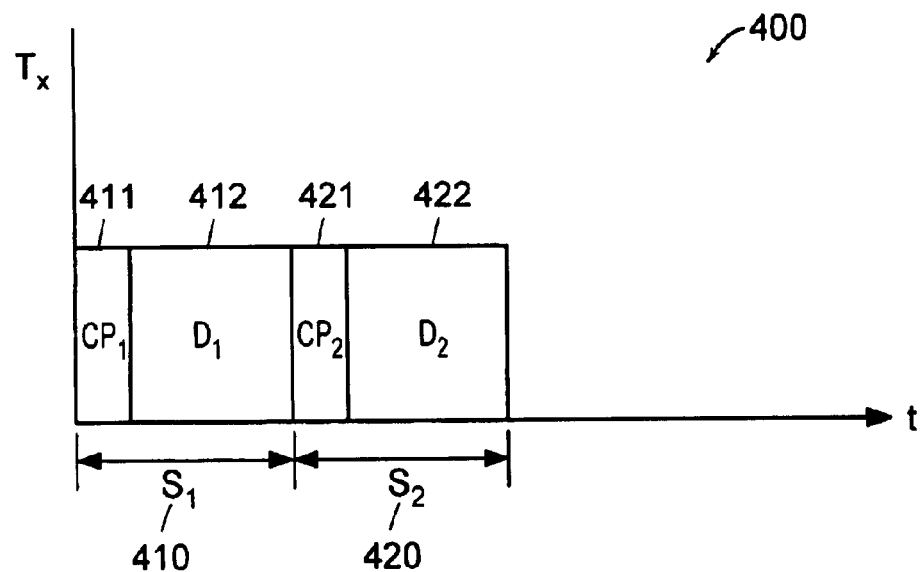
FIG. 4 is a representation of an exemplary transmit signal having two symbols that are transmitted over a dispersive channel with cyclic prefixing.

FIG. 4 shows a representation of an exemplary transmit signal 400 that is transmitted over an ADSL channel, for example, by the ATU-C over the downstream channel. The exemplary transmit signal includes two symbols, $S_1$ (410) and $S_2$ (420). Each transmit symbol consists of T=2N+v samples, where N equals the number of DMT subchannels. Each transmit symbol (410, 420) includes cyclic prefix samples (411, 421) and data samples (412, 422), where the cyclic prefix samples (411, 421) are the last v samples of the data samples (412, 422).

While the CP can make the received signal appear periodic, it also reduces the information-carrying capacity of each symbol. Therefore, in order to maintain high transmission efficiency, the CP length should be short relative to the DMT symbol length. For this reason, the value v is fixed in various ADSL recommendations, typically to one-eighth the number of DMT subchannels (i.e., v=N/8). An ADSL implementation typically utilizes 256 DMT subchannels (G.dmt) or 128 DMT subchannels (G.lite) on the downstream channel, and therefore v is equal to 32 or 16 samples, respectively, on the downstream channel. An ADSL implementation typically utilizes 32 DMT subchannels on the upstream channel, and therefore v is equal to 4 samples on the upstream channel.

Figure 5:
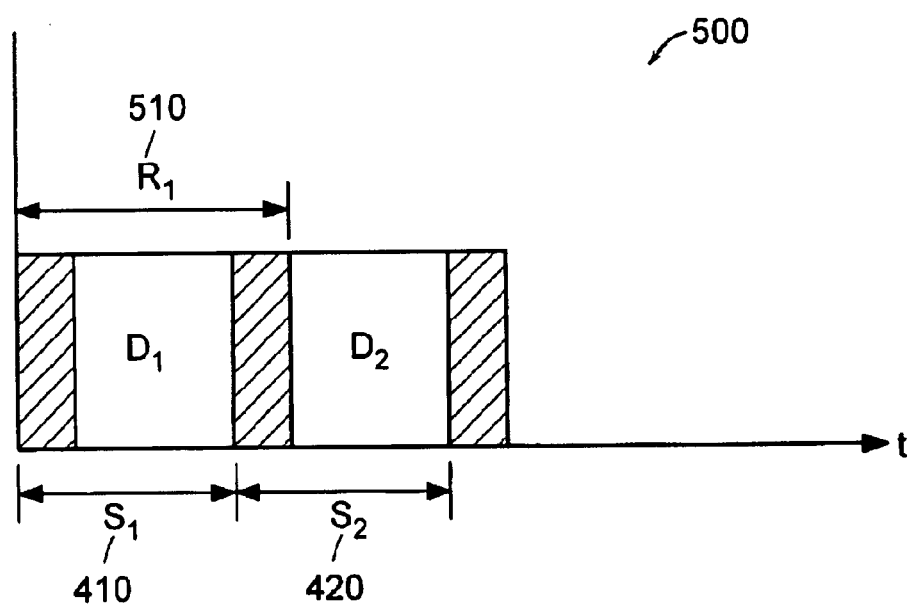
FIG. 5 is a representation of an exemplary receive signal that is received over a dispersive channel when symbols are transmitted over the dispersive channel with cyclic prefixing.

In order for the CP to make the received signal appear periodic, the amount of dispersion imparted to a transmitted symbol by the communication channel cannot extend past the CP of the following transmitted symbol. In other words, the impulse response of the channel cannot cause the length of the received symbol to be greater than 2N+v samples, where N equals the number of DMT subchannels and v equals the CP length. This is demonstrated by example in FIG. 5, which shows a representation of an exemplary receive signal 500 in which the received symbol $R_1$ (510), corresponding to the transmitted symbol $S_1$ (410), does not extend past the CP of the transmitted symbol $S_2$ (420). This puts a significant constraint on impulse response of the communication channel.

Figure 6A:
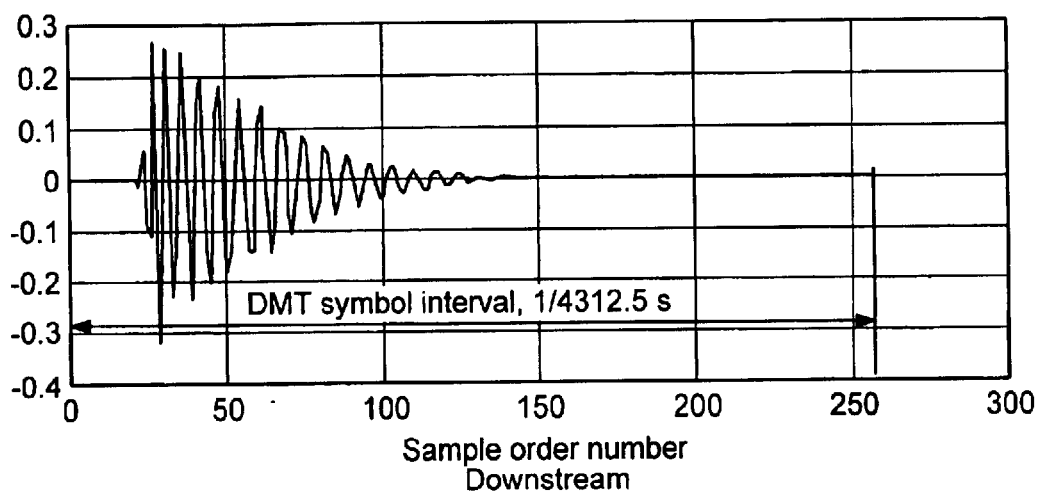
FIG. 6 shows the impulse responses of simulated downstream and upstream G.lite ADSL channels.
Figure 6B:
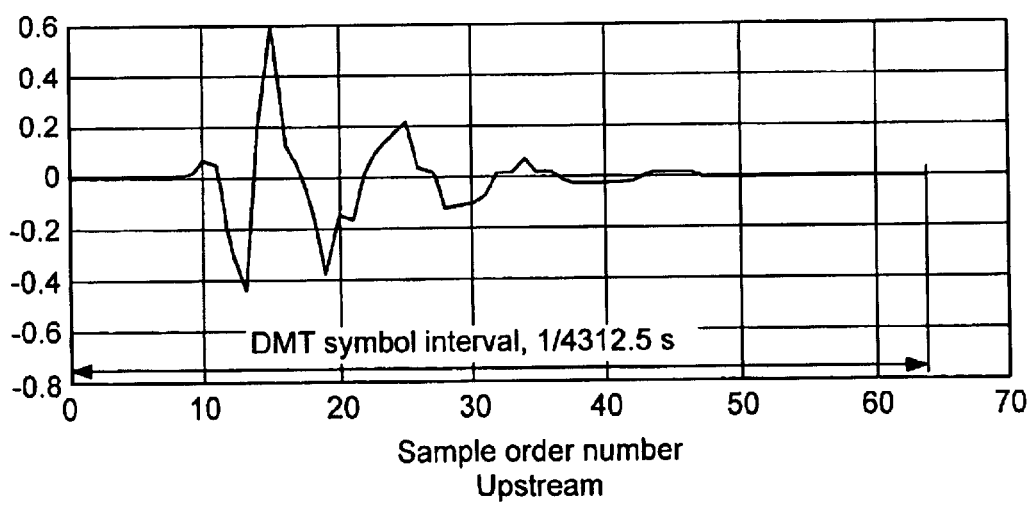

Unfortunately, most subscriber loops are relatively long and have impulse responses that are much longer than the CP length. This can be demonstrated in an exemplary G.lite system that is simulated using ANSI loop #7 with G.lite transceiver filters. FIG. 6(a) shows the impulse response of a simulated downstream G.lite channel. FIG. 6(b) shows the impulse response of a simulated upstream G.lite channel. The impulse response length of each channel (approximately 125 samples for the downstream channel and approximately 40 samples for the upstream channel) is significantly longer than the CP length (16 samples on the downstream channel and 4 samples on the upstream channel). Thus, out of 2N+v received samples, more than v samples will be corrupted due to dispersion, resulting in both ISI and ICI in the received signal.

Solutions to this problem have been sought in both frequency and time domains. The most common approach is to use a TEQ to compress the impulse response of the channel ideally to be equal to or less than the CP length. Then, orthogonality between subcarriers is ensured, and a simple (single complex tap per subcarrier) frequency domain equalizer (FEQ) can be used after the DFT.

In order for the TEQ to effectively compress the impulse response of the channel, the TEQ is "trained" to the impulse response of the channel. Specifically, the TEQ in the ATU-R is trained to the impulse response of the downstream channel, and the TEQ in the ATU-C is trained to the impulse response of the upstream channel. Training involves, among other things, determining a set of TEQ coefficients that provide the required amount of compression. Training is accomplished by transmitting a training signal over the channel and determining the TEQ coefficients based upon the received training signal. Thus, the ATU-R trains its TEQ based upon a training signal transmitted by the ATU-C over the downstream channel, and the ATU-C trains its TEQ based upon a training signal transmitted by the ATU-R over the upstream channel. The training signal typically consists of repeated 2N samples of the pseudo-random number sequence, with no CP added.

Figure 7:
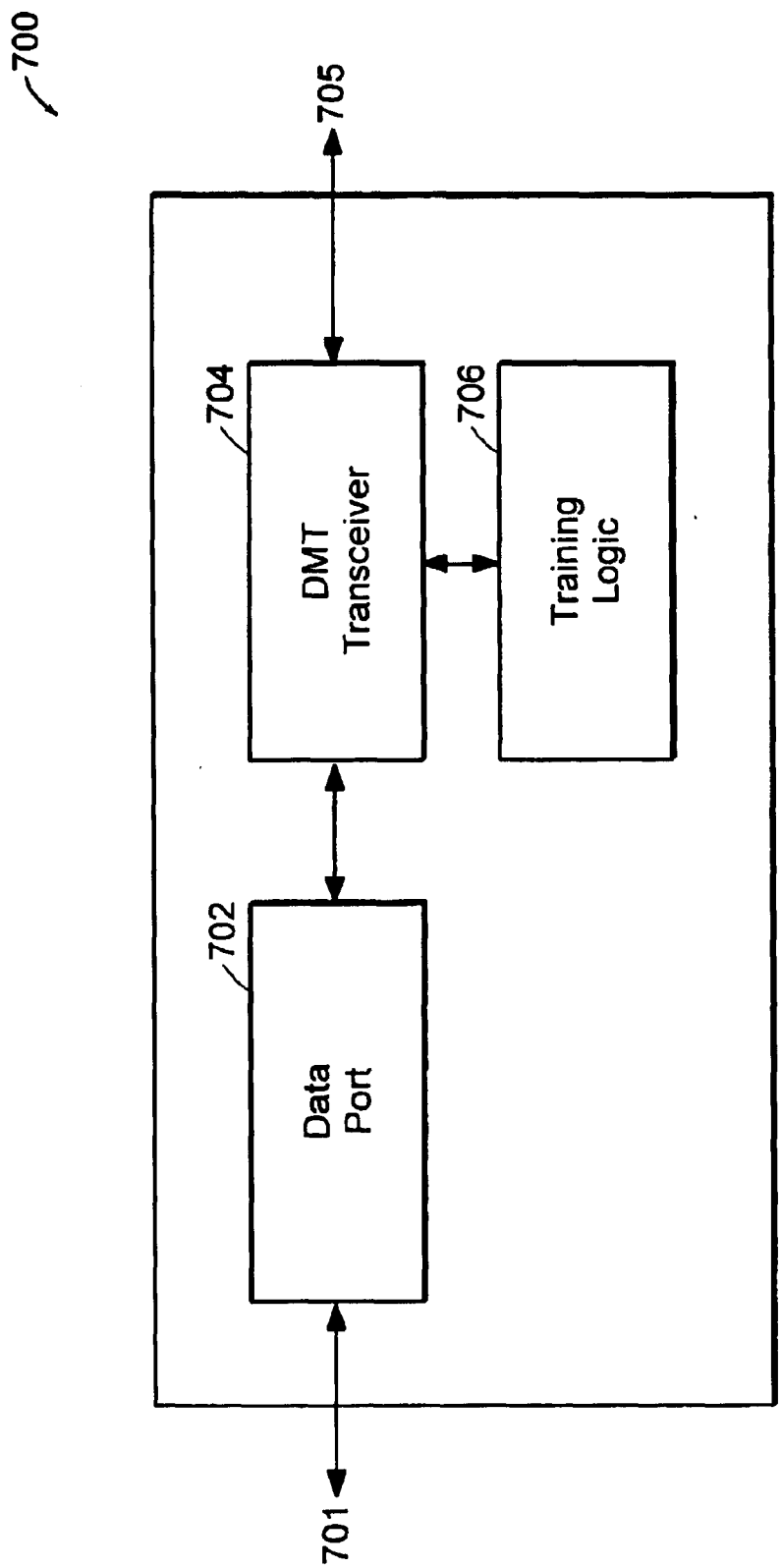
FIG. 7 is a block diagram showing the relevant logic blocks of an exemplary ADSL terminal unit in accordance with an embodiment of the present invention.

FIG. 7 shows the relevant logic blocks of an exemplary ATU 700. Among other things, the ATU includes a data port 702 that is coupled to a DMT transceiver 704, and training logic 706 that is also coupled to the DMT transceiver 704. The data port 702 provides an interface 701 to a computer system, such as a communications network at the telephone company central office (in the case of an ATU-C) or a personal computer at the subscriber site (in the case of an ATU-R), enabling the ATU 700 to send and receive information over the computer system. The DMT transceiver 704 provides an interface 705 to the subscriber loop, enabling the ATU 700 to send and receive information from another ATU over the subscriber loop. The training logic 706 includes various logic for training the components of the DMT transceiver 704, including, among other things, logic for sending a training signal over the subscriber loop and logic (832, FIG. 8) for determining TEQ coefficients based upon a received training signal.

Figure 8:
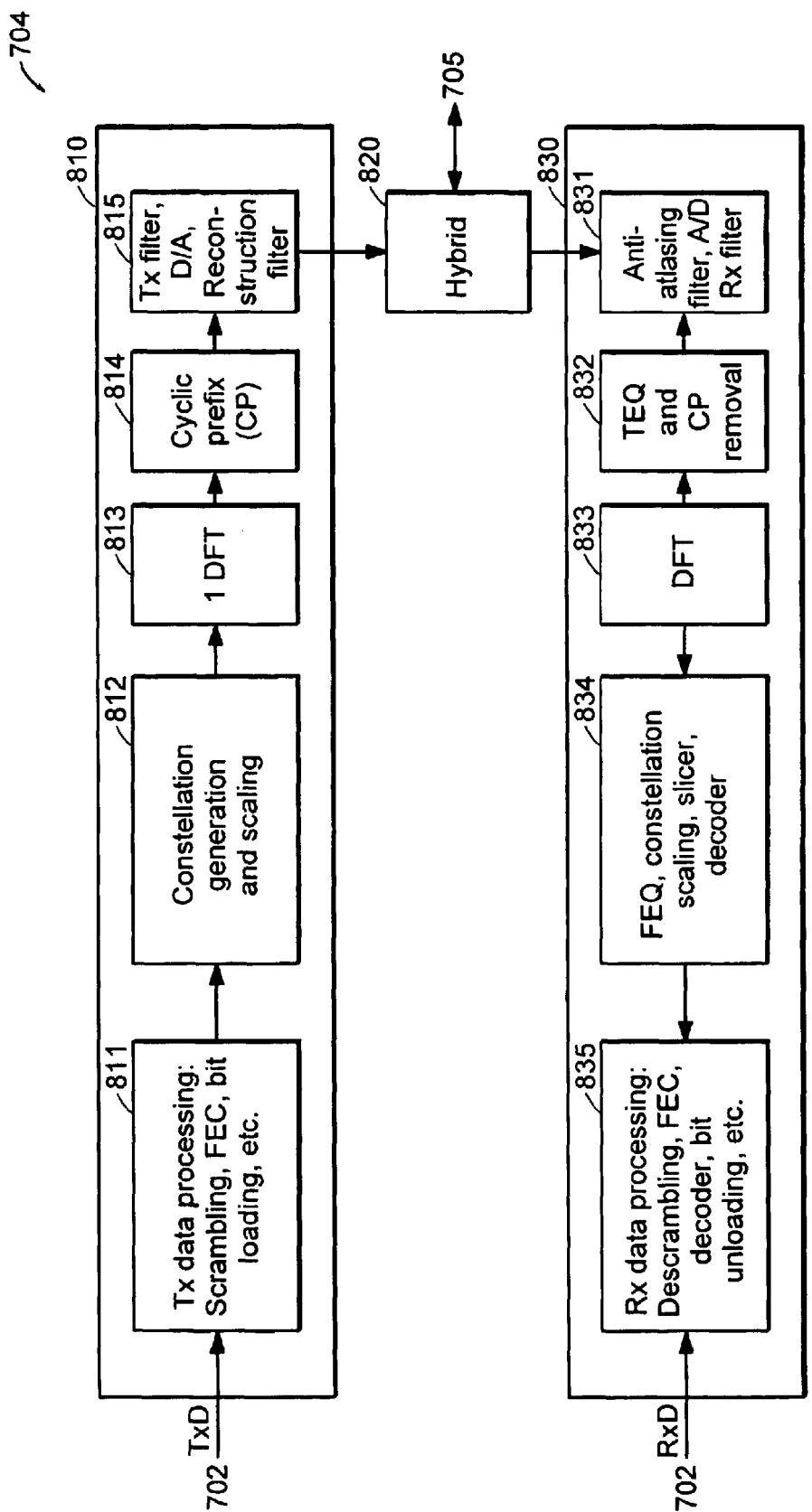
FIG. 8 is a block diagram showing the major logic blocks of an exemplary Discrete Multi-Tone (DMT) transceiver in accordance with an embodiment of the present invention.

FIG. 8 shows the relevant logic blocks of an exemplary DMT transceiver 704 in which only the main functions are included. The DMT transceiver 704 includes a transmitter 810 and a receiver 830 that are coupled to the subscriber loop 705 through a hybrid 820.

At the transmitter 810, transmit data (TxD) from the data port 701 is first processed by the TX data processing block 811, which performs such functions as scrambling, forward error correction (FEC) encoding, and bit loading. The resulting bit stream is then processed by the constellation generation and scaling block 812, which divides the bit stream into small groups, selects a QAM constellation point for each subcarrier (with each constellation point representing a frequency domain sample), scales each frequency domain sample, and extends each block of N frequency domain samples (where N is the number of subcarriers used for transmission) to $N_2=2N$ samples in such a way that the samples are complex-conjugate symmetric around the N-th sample. The samples are then processed by the IDFT block 813, which performs an IDFT and forms a DMT block (symbol) from $N_2$ output time-domain, real-valued samples. Each DMT symbol is processed by the CP block 814, which adds the CP (i.e., the last v samples of the DMT symbol) to the DMT symbol to form a prefixed DMT symbol. The prefixed DMT symbol is processed by block 815, which converts the DMT symbol into a continuous-time signal for transmission over the subscriber loop 705 via the hybrid 820.

At the receiver 830, the continuous-time signal received over the subscriber loop 705 via the hybrid 820 is first processed by block 831, which filters and samples the received signal. The resulting samples are then processed by the TEQ block 832, which performs time-domain equalization and CP removal so that a DMT time-domain symbol with $N_2$ samples is obtained. The resulting samples are then processed by the DFF block 833, which performs a DFT on the time-domain symbol in order to transform the time-domain symbol into $N_2$ frequency samples (where only the first N samples are taken). These frequency samples are processed by the block 834, which performs gain scaling and FEQ on a per-subchannel basis, slices the sample in each subchannel to the nearest constellation point, and decodes the constellation points to recover the transmitted information bits. The resulting bit stream is processed by the RX data processing block 835, which performs such functions as bit unloading, forward error correction (FEC) decoding, and descrambling to produce receive data (RxD) that is forwarded to the data port 702.

As discussed above, the primary function of the TEQ is to "shorten" the transmission channel of a DMT signal so that the combined (shortened) channel has energy confined to the CP window. In order for the TEQ to equalize the channel effectively, the maximum length of the shortened channel impulse response following time-domain equalization is (v+1) samples, where v is the CP length. Additionally, the channel flattening and noise amplification effects of the TEQ must be considered.

Figure 9:
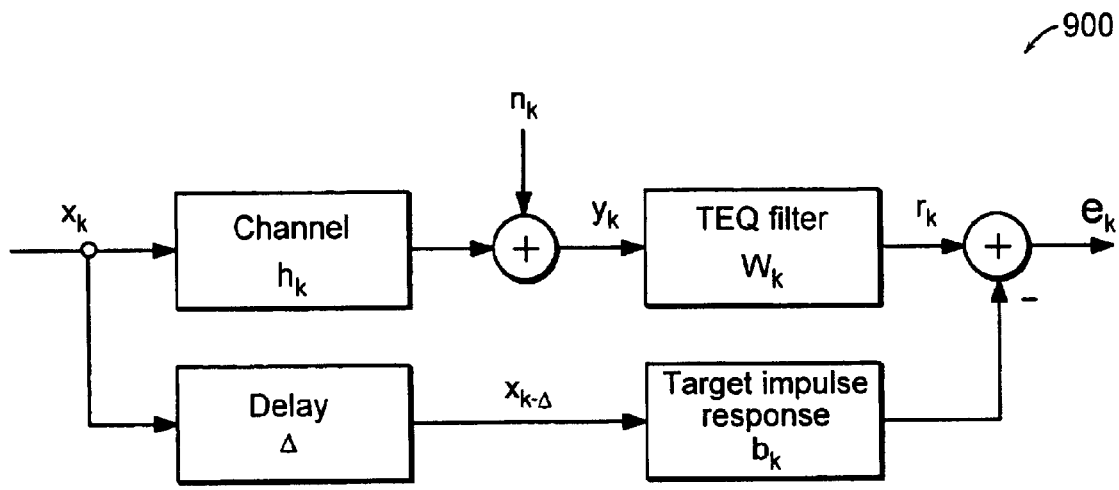
FIG. 9 is a representation of a time-domain equalized channel.

The problem of determining the TEQ coefficients for channel impulse response shortening is discussed with reference to FIG. 9. In FIG. 9, $x_k$ represents the transmitted signal, $h_k$ represents the channel impulse response of the subscriber loop, $n_k$ represents various noise components, $y_k$ represents the combined signal (channel impulse response and noise) presented to the TEQ, $w_k$ represents the impulse response of the TEQ, $r_k$ represents the combined (shortened) impulse response of the channel, $\Delta$ represents the delay introduced by the transmission channel excluding the delay of the target channel, and $b_k$ represent the target impulse response (TIR) of the target channel. It is assumed that the channel impulse response ($h_k$) includes all transmit and receive transceiver filters in addition to the actual local loop channel. The noise term ($n_k$) includes crosstalk, thermal, and quantization noise, as well as radio frequency interference (RFI). TEQ coefficients ($w_k$) are chosen such that the impulse response of the combined channel and TEQ filters (upper branch) matches as close as possible the lower branch. The TIR ($b_k$) has maximum length of (v+1) samples. A known pseudo-random sequence $x_k$ with the period equal to the one DMT symbol interval is used for the TEQ training.

The error sequence $e_k$ can be expressed as:

$$e_k = w_k * y_k - b_k * x_{k-\Delta} = w^T y_k - b^T x_k \qquad (1)$$

where "*" denotes linear convolution and the bold characters represent vectors (as well as matrices) as follows:

$w=[w_0, w_1, \ldots, w_{M-1}]^T$, where M is the number of TEQ coefficients, $b=[b_0, b_1, \ldots, b_v]^T$, where v is the CP length, $x_k=[x_{k-\Delta}, x_{k-\Delta-1}, \ldots, x_{k-\Delta-v}]^T$, $y_k=[y_k, y_{k-1}, \ldots, y_{k-M+1}]^T$.

The TEQ tap coefficients can be obtained, for example, by finding the values for TEQ (w), TIR (b), and delay ($\Delta$) that minimize the Mean Squared Error (MSE), which is defined as:

$$MSE = E\{e_k^2\} = E\{(w^T y_k - b^T x_k)^2\} = w^T R_{yy} w + b^T R_{xx} b - 2 w^T R_{yx} b,$$

where the correlation matrices are defined as:

$$R_{xx} = E\{x_k x_k\}, \ R_{yy} = E\{y_k y_k\}, \ R_{yx}^{\Delta} = E\{y_k x_k\} = (R_{xy}^{\Delta})^T \qquad (2)$$

In order to avoid a trivial solution in which the TEQ and TIR taps are equal to zero, some constraints are typically imposed on TEQ or TIR coefficients.

One commonly used constraint requires that the norm of either the TEQ taps or the TIR taps equals unity (i.e., $w^T w=1$ or $b_T b=1$, respectively). In this case, the equalizer taps are obtained by solving the eigenvector problem [3].

Another commonly used constraint is the "unit tap constraint" (UTC), which requires one of the TIR taps to equal unity [13]. This can be written as $b^T e_i=1$, where $e_i$ is a unit vector having all elements zero except for the i-th element, which equals unity. For convenience, a model that uses such a constraint is referred to hereinafter as a "UTCb" model, and is used as a reference model for performance comparisons against results obtained from various embodiments of the present invention.

UTCb Reference Model

Briefly, the UTCb model obtains the preferred TEQ coefficients by determining TEQ coefficients for each $\Delta \epsilon [0, N_2-v-1]$ and selecting as the preferred TEQ coefficients the TEQ coefficients providing the overall minimum MSE. The UTCb model determines TEQ coefficients for a particular $\Delta$ by performing the following steps:

Step 1—Applying second order statistics (2) and the selected value $\Delta$, calculate the following (v+1) by (v+1) matrix:

$$Q_w^{\Delta} = R_{xx} - R_{xy}^{\Delta} R_{yy}^{-1} R_{yx}^{\Delta}$$

Step 2—Find minimum diagonal element ($i_{opt}, i_{opt}$ position) of:

$(Q_w^{\Delta})^{-1}$, i.e. $[(Q_w^{\Delta})^{-1}]_{i_{opt}, i_{opt}}$

Step 3—Calculate TIR coefficients and corresponding MSE:

$$b_{opt} = \frac{(Q_w^{\Delta})^{-1} e_{i_{opt}}}{[(Q_w^{\Delta})^{-1}]_{i_{opt}, i_{opt}}}, \quad MSE_{opt} = \frac{1}{[(Q_w^{\Delta})^{-1}]_{i_{opt}, i_{opt}}}$$

Step 4—Calculate corresponding TEQ coefficients:

$$w_{opt} = R_{yy}^{-1} R_{yx}^{\Delta} b_{opt}$$

The preferred TEQ coefficients are those that give the overall minimum MSE, i.e., $(w_{opt})_{minMSE}$.

The UTCb model performs well for time-domain equalization of ADSL channels. One problem with the UTCb model, however, is that implementation of the UTCb model is computationally intensive. This is due, in part, because iterations are performed for each $\Delta \epsilon [0, N_2-v-1]$.

Figure 10:
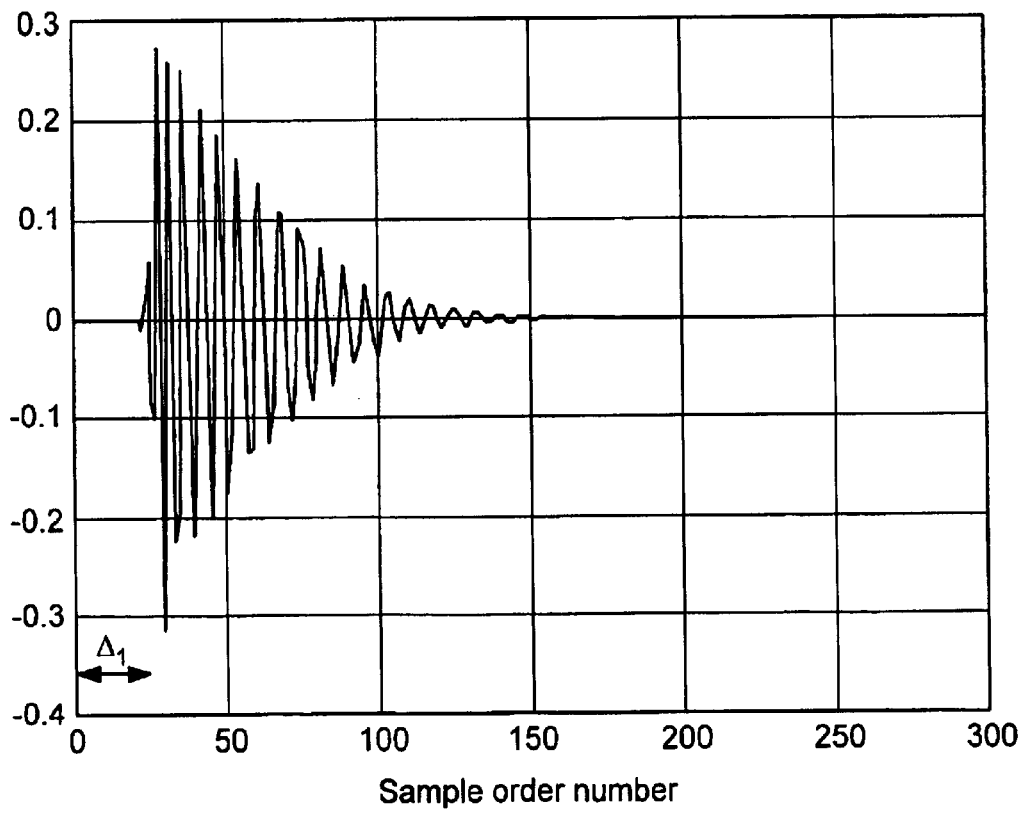
FIG. 10 shows the shortened channel impulse response delay obtained from a reference model as known in the art.

Fewer iterations can be performed without loss of performance by limiting the search range to $\Delta \epsilon [\Delta_1, N_2-v-1]$, where $\Delta_1$ is the sample order number (k) of $h_k$ where the block of v most powerful consecutive samples begins. FIG. 10 shows the value $\Delta_1$ for a simulated downstream G.lite channel.

Figure 11:
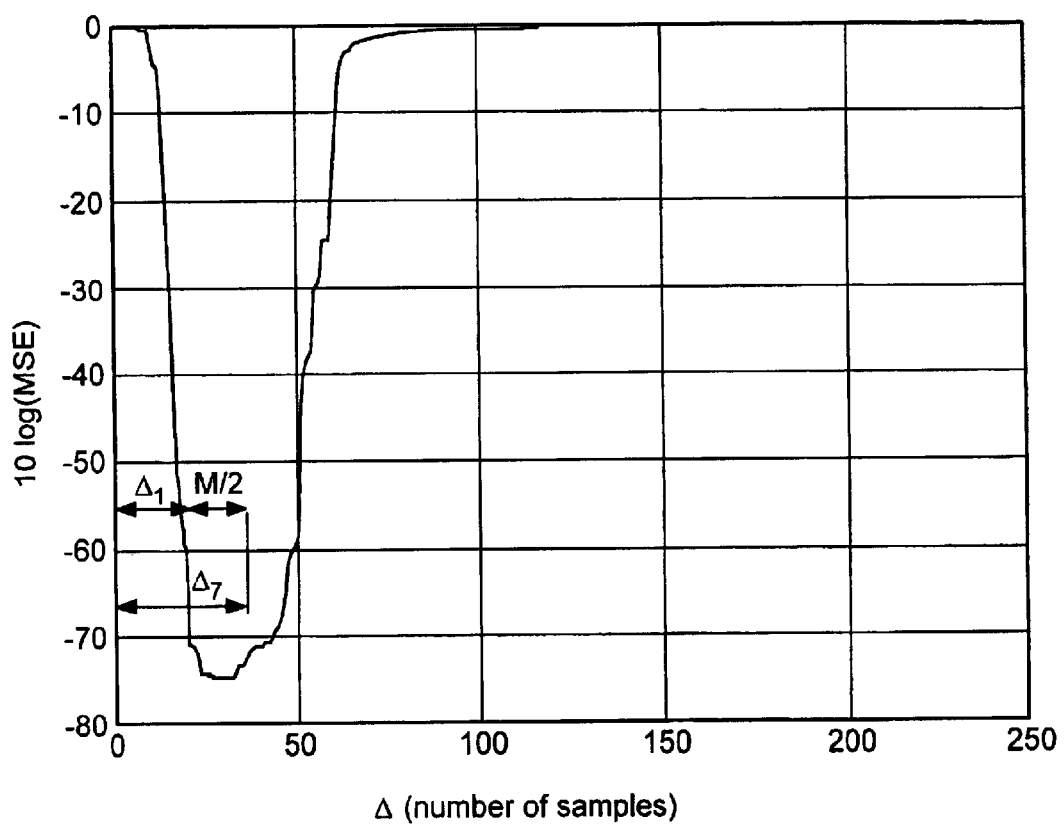
FIG. 11 shows the shortened channel impulse response delay obtained heuristically for a reference model as known in the art.

Furthermore, very little performance is lost if the UTCb model is applied for a single, heuristically found value of $\Delta = \Delta_2 = \Delta_1 + M/2$, where M is the TEQ filter length. As shown in FIG. 11, the value $\Delta_2$ provides an acceptably low MSE, although it may not be the optimal value for $\Delta$ overall.

Two-Channel Auto-Regressive (TC-AR) Model

In an embodiment of the present invention, the TEQ design is based upon an auto-regressive moving average (ARMA) model, which in turn is converted into a two-channel auto-regressive (TC-AR) model through embedding. The approach of embedding an ARMA model into a TC-AR model is discussed in [5]. Certain advantages of using embedding are discussed in [6].

In the ARMA model, the input and output signals of discrete multitones (DMT) are associated with the parameters of a zero polynomial and a pole polynomial, respectively, thereby resulting in a pole-zero model. The ARMA (pole-zero) model of the channel results in a non-Toeplitz autocorrelation matrix for which there are no computationally efficient solutions.

However, embedding an ARMA model into a TC-AR model produces a model consisting of poles only. With embedding, the input and output signals form a column vector of dimension two, or two channels, and correlation parameters related to the predication vector of the TC-AR model are represented by 2×2 matrices. Thus, the TC-AR model of the channel results in a Toeplitz autocorrelation matrix, the elements of which are 2×2 matrices rather than scalars. Application of this approach to the shortening of long feed-forward and feed-back FIR filters of a channel equalizer is discussed in [7] and [8].

The parameters of the TC-AR model can be solved recursively using the well-known Levinson, Wiggins, Whittle, Robinson (LWWR) algorithm, which is referred to hereinafter as the multichannel Levinson algorithm. A full derivation of the multichannel Levinson algorithm is presented in [9], [10], and [11].

Briefly, the ARMA (pole-zero) model assumes that the transfer function of the unknown system, H(z), has the form:

$$\hat{H}(z) = \frac{\hat{Y}(z)}{X(z)} = \frac{\sum_{k=0}^{q} b_k z^{-k}}{1 + \sum_{k=1}^{p} a_k z^{-k}} \approx \frac{Y(z)}{X(z)} = H(z) \tag{3}$$

where p is the number of poles, q the number of zeros, and X(z) and Y(z) are the input and output of the unknown system, respectively. An equivalent representation in the time domain is:

$$e_k = y_k - \hat{y}_k \tag{4}$$

where $y_k$ is the output sample and $\hat{y}_k$ is the modeled output sample.

The output sample $y_k$ is represented by $$y_k = \sum_0^L h_l x_{k-l}.$$

The ARMA (pole-zero) model is used to model the input-output relationship, which is characterized by the physical channel impulse response $\{h_k\}$. Starting with a (p,q) pole-zero model, where p is the number of poles and q is the number of zeros of the model, the modeled output sample, $\hat{y}_k$, can be written as:

$$\hat{y}_k = -a_1 \hat{y}_{k-1} - a_2 \hat{y}_{k-2} - \ldots - a_p \hat{y}_{k-p} + b_0 x_k + b_1 x_{k-1} + \ldots + b_q x_{k-q} \tag{5}$$

For the cases where $p \geq q$, the objective is to estimate the (p+q+1) ARMA parameters $\{a_1, \ldots, a_p, b_0, \ldots, b_q\}$ based upon the knowledge of the second-order statistics of the input and output sequences $\{y_k, x_k\}$. Denoting these estimates at the jth recursion $(1 \leq j \leq p)$ by $\{a_1^j, \ldots, a_p^j, b_0^j, \ldots, b_{j-\delta}^j\}$ where $\delta = p-q$, the output sample $y_k$ can be represented as:

$$y_k \hat{y}_k + e_k^j a_1^j \hat{y}_{k-1} - a_2^j \hat{y}_{k-2} - \ldots - a_j^j \hat{y}_{k-j} + b_0^j x_k + b_1^j x_{k-1} + \ldots + b_{j-\delta}^j x_{k-j-\delta} + e_k^j, \tag{6}$$

where $e_k^j$ is the jth-order residual error sequence and $b_i^j=0$ for i<0. At the jth recursion, an estimate of the ARMA model is determined in which the difference between the number of poles and zeros is also δ, i.e., equal to the desired difference p−q.

Estimating the parameters of the ARMA model described in (5) needs the correlation matrix. In this case, it is a non-Toeptitz matrix for which there exists no computationally efficient solution. Instead, the method of embedding an ARMA model into a two-channel AR model is used to generate a model consisting of poles only [5], [7], [8]. The correlation matrix then takes a Toeplitz form, and the multichannel Levinson algorithm can be used to solve the model parameters.

Assuming that $\{x_k\}$ is white (which is approximately true for the time-domain DMT signal) and that $\hat{y}_{k-i} = y_{k-i}$ for $1 \leq i \leq p$, (i.e., that the previous estimates are accurate), and defining a vector $$z_k = \begin{bmatrix} y_k \\ x_{k+\delta} \end{bmatrix},$$

then the ARMA model of (6) can be converted to the two-channel-AR model as:

$$z_k = -\Theta_1^j z_{k-1} - \ldots - \Theta_{\delta-1}^j z_{k-\delta-1} - \Theta_\delta^j z_{k-\delta} - \ldots - \Theta_j^j z_{k-j} + \begin{bmatrix} e_k^j \\ x_{k+\delta} \end{bmatrix} = \hat{z}_k + e_k,$$

in which the forward prediction coefficient matrices of the linear predictor $\hat{z}_k$ are defined as:

$$-\Theta_1^j = \begin{cases} \begin{bmatrix} -a_i^j & 0 \\ 0 & 0 \end{bmatrix}, & 1 \leq i \leq \delta - 1 \\ \begin{bmatrix} -a_i^j & b_{i-\delta}^j \\ 0 & 0 \end{bmatrix}, & \delta \leq i \leq j. \end{cases} \quad (7)$$

Applying the orthogonality principle, which deals with the real signal only and states that $E[(z_k - \hat{z}_k)z_{k-i}^T] = 0$ (where $i=1,2,\ldots,j$ and T denotes transpose), results in:

$$E\left[\left(z_k + \sum_{m=1}^{j} \Theta_m^j z_{k-m}\right) z_{k-i}^T\right] = 0 \quad (8)$$

or equivalently:

$$R(i) + \Theta_1^j R(i-1) + \ldots + \Theta_j^j R(i-j) = 0, \quad 1 \leq i \leq j \quad (9)$$

in which the autocorrelation matrix is defined as:

$$R(i) = E[z_k z_{k-i}^T] = \begin{bmatrix} R_{yy}(i) & R_{yx}(i-\delta) \\ R_{xy}(i+\delta) & R_{xx}(i) \end{bmatrix} = R^T(-i). \quad (10)$$

Combining (8), (9), and (10) for the case i=0 results in:

$$E[(z_k - \hat{z}_k) z_k^T] = \quad (11a)$$

$$E\left[\left(z_k + \sum_{m=1}^{j} \Theta_m^j z_{k-m}\right) z_k^T\right] = R(0) + \sum_{m=1}^{j} \Theta_m^j R(-m) = E[e_k e_k^T] = \Sigma_j^f.$$

That is, $$R(0) + \Theta_1^j R(-1) + \ldots + \Theta_j^j R(-j) = \Sigma_j^f. \quad (11b)$$

Combining (9) and (11b) results in the jth-order two-channel AR model in matrix form, as follows:

$$[\Theta_j^j \ldots \Theta_1^j \ I] \begin{bmatrix} R(0) & \ldots & R(-(j-1)) & R(-j) \\ \vdots & \ddots & \vdots & \vdots \\ R(j-1) & \ldots & R(0) & R(-1) \\ R(j) & \ldots & R(1) & R(0) \end{bmatrix} = [0 \ \ldots \ 0 \ \Sigma_j^f]. \quad (12)$$

Similarly, the equation for the backward prediction vector can be derived as:

$$[I \ \Phi_1^j \ \ldots \ \Phi_j^j] \begin{bmatrix} R(0) & \ldots & R(-(j-1)) & R(-j) \\ \vdots & \ddots & \vdots & \vdots \\ R(j-1) & \ldots & R(0) & R(-1) \\ R(j) & \ldots & R(1) & R(0) \end{bmatrix} = [\Sigma_j^b \ 0 \ \ldots \ 0]. \quad (13)$$

Combining (12) and (13) results in:

$$\begin{bmatrix} \Theta_j^j & \ldots & \Theta_1 & I \\ I & \Phi_1 & \ldots & \Phi_j^j \end{bmatrix} \begin{bmatrix} R(0) & \ldots & R(-(j-1)) & R(-j) \\ \vdots & \ddots & \vdots & \vdots \\ R(j-1) & \ldots & R(0) & R(-1) \\ R(j) & \ldots & R(1) & R(0) \end{bmatrix} = \begin{bmatrix} 0 & \ldots & 0 & \Sigma_j^f \\ \Sigma_j^b & 0 & \ldots & 0 \end{bmatrix}. \quad (14)$$

In the next iteration (i.e., j→j+1), (14) becomes:

$$\begin{bmatrix} \Theta_{j+1}^{j+1} & \ldots & \Theta_1^{j+1} & I \\ I & \Phi_1^{j+1} & \ldots & \Phi_{j+1}^{j+1} \end{bmatrix} \begin{bmatrix} R(0) & \ldots & R(-j) & R(-(j+1)) \\ \vdots & \ddots & \vdots & \vdots \\ R(j) & \ldots & R(0) & R(-1) \\ R(j+1) & \ldots & R(1) & R(0) \end{bmatrix} = \begin{bmatrix} 0 & \ldots & 0 & \Sigma_{j+1}^f \\ \Sigma_{j+1}^b & 0 & \ldots & 0 \end{bmatrix}. \quad (15)$$

The following are now defined:

$$\begin{bmatrix} 0 \dots 0 & \Sigma_{j+1}^f \\ \Sigma_{j+1}^b & 0 \dots 0 \end{bmatrix} = \begin{bmatrix} I & K_{j+1}^f \\ K_{j+1}^b & I \end{bmatrix} \begin{bmatrix} \alpha \dots 0 & \Sigma_j^f \\ \Sigma_j^b & 0 \dots \beta \end{bmatrix}, \text{ and} \quad (16)$$

$$C^{j+1} = \begin{bmatrix} R(0) & \dots & R(-j) & R(-(j+1)) \\ \vdots & \ddots & \vdots & \vdots \\ R(j) & \dots & R(0) & R(-1) \\ R(j+1) & \dots & R(1) & R(0) \end{bmatrix}.$$

Combining (15) and (16) results in:

$$\begin{bmatrix} \Theta_{j+1}^{j+1} \dots \Theta_1^{j+1} & I \\ I & \Phi_1^{j+1} \dots \Phi_{j+1}^{j+1} \end{bmatrix} C^{j+1} = \begin{bmatrix} \alpha + K_{j+1}^f \Sigma_j^b & 0 \dots \Sigma_j^f + K_{j+1}^f \beta \\ K_{j+1}^b \alpha + \Sigma_j^b & 0 \dots K_{j+1}^b \Sigma_j^f + \beta \end{bmatrix}. \quad (17)$$

Rewriting the right side of (17) and also using (15) results in (18), as follows:

$$\begin{bmatrix} K_{j+1}^f [\Sigma_j^b \ 0 \ \dots \ 0 \ \beta] + [\alpha \ 0 \dots 0 \ \Sigma_j^f] \\ K_{j+1}^b [\alpha \ 0 \dots 0 \ \Sigma_j^f] + [\Sigma_j^b \ 0 \ \dots \ 0 \ \beta] \end{bmatrix} = \begin{bmatrix} K_{j+1}^f [I \ \Phi_1^j \ \dots \ \Phi_j^j \ 0] + [0 \ \Theta_j^j \ \dots \ \Theta_i^j \ I] \\ K_{j+1}^b + [0 \ \Theta_j^j \ \dots \ \Theta_i^j \ I] + [I \ \Phi_1^j \ \dots \ \Phi_j^j \ 0] \end{bmatrix} C^{j+1}$$

From (18), it can be seen that:

$$\begin{bmatrix} \Sigma_j^b \ 0 \ \dots \ 0 \ \beta \\ \alpha \ 0 \dots 0 \ \Sigma_j^f \end{bmatrix} = \begin{bmatrix} I \ \Phi_1^j \ \dots \ \Phi_j^j \ 0 \\ 0 \ \Theta_j^j \ \dots \ \Theta_i^j \ I \end{bmatrix} C^{j+1}. \quad (19)$$

where:

$$\alpha = \Theta_j^j R(1) + \dots + \Theta_1^j R(j) + R(j+1), \quad (20a)$$

$$\beta = \Phi_j^j R(-1) + \dots + \Phi_1^j R(-j) + R(-(j+1)), \quad (20b)$$

It can also be proven that:

$$\beta = \alpha^T. \quad (21)$$

From (16), it can be seen that $\alpha + K_{j+1}^f \Sigma_j^b = 0$ and $\beta + K_{j+1}^b \Sigma_j^f = 0$, and therefore:

$$K_{j+1}^f = -\alpha(\Sigma_j^b)^{-1}, \quad (22a)$$

$$K_{j+1}^b = -\beta(\Sigma_j^f)^{-1}. \quad (22b)$$

Comparing the left-side of (17) with the right-side of (18), it can be seen that:

$$\Theta_i^{j+1} = \Theta_i^j + K_{j+1}^f \Phi_{j-i+1}^j \quad 1 \leq i \leq j \quad (23a)$$

$$\Phi_i^{j+1} = \Phi_i^j + K_{j+1}^b \Theta_{j-i+1}^j \quad 1 \leq i \leq j \quad (23b)$$

From (16), it can be seen that:

$$\Sigma_{j+1}^f = \Sigma_j^f + K_{j+1}^f \beta \quad (24a)$$

$$\Sigma_{j+1}^b = \Sigma_j^b + K_{j+1}^b \alpha \quad (24b)$$

Noting that $\alpha + K_{j+1}^f \Sigma_j^b$ and $\beta + K_{j+1}^b \Sigma_j^f$, (24a) and (24b) can be rewritten as:

$$\Sigma_{j+1}^f = (I - K_{j+1}^f K_{j+1}^b)\Sigma_j^f, \quad (25a)$$

$$\Sigma_{j+1}^b = (I - K_{j+1}^b K_{j+1}^f)\Sigma_j^b. \quad (25b)$$

Similarly, by comparing the left-side of (17) with the right-side of (18), it can be seen that:

$$\Theta_{j+1}^{j+1} = K_{j+1}^f, \quad (26a)$$

$$\Phi_{j+1}^{j+1} = K_{j+1}^b. \quad (26b)$$

Substituting (21) into (22b) and (26) into (22), (23), and (25) results in the equations of recursion (27), as follows:

Recursions: $1 \leq j \leq p-1$

-continued $$\alpha = \Theta_j^j R(1) + \dots + \Theta_1^j R(j) + R(j+1) \quad (27a)$$

$$\Theta_{j+1}^{j+1} = -\alpha(\Sigma_j^b)^{-1} \quad (27b)$$

$$\Phi_{j+1}^{j+1} = -\alpha^T(\Sigma_j^f)^{-1} \quad (27c)$$

$$\Theta_i^{j+1} = \Theta_i^j + \Theta_{j+1}^{j+1}\Phi_{j-i+1}^j \quad 1 \leq i \leq j \quad (27d)$$

$$\Phi_i^{j+1} = \Phi_i^j + \Phi_{j+1}^{j+1}\Theta_{j-i+1}^j \quad 1 \leq i \leq j \quad (27e)$$

$$\Sigma_{j+1}^f = (I - \Theta_{j+1}^{j+1}\Phi_{j+1}^{j+1})\Sigma_j^f \quad (27f)$$

$$\Sigma_{j+1}^b = (I - \Phi_{j+1}^{j+1}\Theta_{j+1}^{j+1})\Sigma_j^b. \quad (27g)$$

The initial conditions for the recursion (28) can be derived from the zeroth-order forward and backward predictors, as follows:

Initial Conditions:

$$\Theta_1^1 = -R(1)(R(0))^{-1} \quad (28a)$$

$$\Phi_1^1 = -R(-1)(R(0))^{-1} \quad (28b)$$

$$\Sigma_1^f = (I - \Theta_1^1 \Phi_1^1)R(0) \quad (28c)$$

$$\Sigma_1^b = (I - \Phi_1^1 \Theta_1^1)R(0) \quad (28d)$$

Upon the completion of recursions, the TEQ coefficients are obtained directly from the relationship shown in (7), that is, the first entry of matrix $\Theta_i^p$, $1 \leq i \leq p$, $$w_0 = a_0^p = 1,$$

$$w_i = a_i^p = \Theta_i^p(1,1) \quad 1 \leq i \leq p \quad (29)$$

For the case where p=q, that is, δ=0, the TC-AR model takes a slightly different form. Defining $$z_k = \begin{bmatrix} y_k \\ x_k \end{bmatrix},$$

the input-output relationship is now:

$$z_k = -\Theta_1^j z_{k-1} - \ldots - \Theta_j^j z_{k-j} + \begin{bmatrix} 1 & b_0^j \\ 0 & 1 \end{bmatrix} \begin{bmatrix} e_k^{rj} \\ x_k \end{bmatrix} \quad (30)$$

where $-\Theta_i^j = \begin{bmatrix} -a_i^j & b_i^j \\ 0 & 0 \end{bmatrix}, 1 \le i \le j,$ The same recursions of (27) with the initial conditions of (28) can be used to estimate the model parameters. At the end of recursion, we have $\{a_1^p, \ldots, a_p^p, b_1^p, \ldots, b_p^p\}$ estimated with $b_0^p$ determined as $b_0^p = \Sigma_p^f(1,2)/R_{xx}(0)$. The TEQ coefficients are obtained in the same manner as in (29).

For the case where p<q, the roles of the input and output need to be interchanged in order to use the recursions of (27) to estimate the model parameters. Specifically, the two-channel vector $$z_k = \begin{bmatrix} x_k \\ y_{k+\delta} \end{bmatrix}$$

is defined, where in this case $\delta = q-p$. The TC-AR model is then:

$$z_k = -\Theta_1^j z_{k-1} - \ldots - \Theta_{\delta-1}^j z_{k-\delta-1} - \quad (31)$$

$$\Theta_\delta^j z_{k-\delta} - \ldots - \Theta_j^j z_{k-j} + \begin{bmatrix} e_k''^j \\ y_{k+\delta} \end{bmatrix} = \hat{z}_k + e_k''$$

where:

$$-\Theta_i^j = \begin{cases} \begin{bmatrix} -b_i^j & 0 \\ 0 & 0 \end{bmatrix}, & 1 \le i \le \delta-1 \\ \begin{bmatrix} -b_i^j & a_{i-\delta}^j \\ 0 & 0 \end{bmatrix}, & \delta \le i \le j. \end{cases} \quad (32)$$

Since $z_k$ is defined differently, the correlation matrix now takes the form of:

$$R(i) = E[z_k z_{k-i}^T] = \begin{bmatrix} R_{xx}(i) & R_{xy}(i-\delta) \\ R_{yx}(i+\delta) & R_{yy}(i) \end{bmatrix} = R^T(-i). \quad (33)$$

The recursions of (27) with the same initial conditions of (28) are directly applicable to this case for estimating $\{a_0^q, \ldots, a_p^q, b_1^q, \ldots, b_q^q\}$ with $b_0^q = 1$. The TEQ coefficients are then obtained as:

$$w_i = a_i^q = -\Theta_{i+\delta}^q(1,2) \quad 0 \le i \le p \quad (34)$$

Estimating the TC-AR model parameters requires the computation of correlation matrices defined either in (10) for $p \ge q$ or (33) for p<q. These correlation quantities can be computed directly from the received time-domain DMT signal and the known input signal during training. In order to suppress noise, correlation sequences maybe computed repeatedly over many DMT symbols and then averaged. Alternatively, the impulse response of the physical channel can be estimated from the received DMT signal and the known input signal via FFT/IFFT, and the impulse response can be directly assigned to the correlation sequences.

As described before, the time-domain DMT input sequence is approximately white. Therefore, $$R_{xx}(l) = S_x \delta_l; R_{yy}(l) = S_x \sum_{m=0}^{L} h_m h_{m-l}; R_{yx}(l) = S_x h_l = R_{xy}(-l),$$

where $S_x$ is the average energy of the input signal.

ARMA model order selection is an important component in generating an accurate approximation of the channel. Subscriber loops in typical carrier service areas have different lengths and configurations (such as the existence or non-existence of bridged-taps). In order to more precisely model the impulse responses of subscriber loops, models with different pole-zero orders may be used. However, the subscriber loop characteristics are not known to the ATU before a connection is established, so the model order for a particular subscriber loop is not known a priori. Therefore, the model order must be determined dynamically.

In an ARMA model, the model order is determined by the number of zeros and the number of poles. The number of zeros (q) is determined according to the CP length, such that $q \le (v+1)$. The number of poles (p) is constrained by the complexity of the system. If either is too large, then IEQ performance degrades. Therefore, they should not be made arbitrarily long.

Various tests have been proposed in the literature for determining p and q from the output sequence $y_k$ or from its autocorrelation function $R_{yy}[10]$. One approach, discussed in [7] and [8], utilizes a "brute force" approach. In this approach, maximum allowable complexity is assumed, which in turn sets the upper bound for values of p and q. Next, an exhaustive search is performed over different choices of p and q, within the allowable range, until an acceptable approximation is found based upon some predetermined statistic, which is typically the mean squared error (MSE), although other statistics such as signal-to-distortion ratio (STDR) or shortened signal-to-noise ratio (SSNR) may alternatively be used. However, it is important to emphasize that increasing p and/or q could result in a worse approximation, depending on the channel impulse response $h_k$.

An embodiment of the present invention reduces the number of searches needed to obtain the TEQ coefficients by only performing searches for (p-q)=x. Typically, no search is performed for p=0. This is possible because the parameters of a low-order TC-AR model can be obtained from those of a high-order model if the order differential between the pole and zero polynomials remains the same.

Consider the forward prediction coefficient matrix deemed in (7) for the fixed value of $\delta$, that is, the order differential between the pole polynomial and the zero polynomial. In each new recursion, one more prediction coefficient matrix is obtained while the matrices obtained in previous recursions are updated. Therefore, as in the single-channel AR modeling case, the prediction coefficients of a low-order model can be obtained from a high-order model. To provide reasonable performance, the lowest order may be limited to the one at which the predetermined statistic (e.g., MSE) is below a predefined level.

In such an embodiment, searching starts from a high-order model with a fixed $\delta$, for example, the model with 32 poles for the case $p \geq q$ or 32 zeros for the case $p<q$. Then correlation matrices are computed according to the high-order model and the multichannel Levinson algorithm is applied in order to determine TEQ coefficients for the particular value of $\delta$. At each recursion j, $\{a_1^{j+1}, \ldots, a_{j+1}^{j+1}\}$ is stored, with $a_0^{j+1} = 1$ for $p \geq q$ or $\{a_0^{j+1}, \ldots, a_{j+1-\delta}^{j+1}\}$ for $p < q$.

Multiple sets of TEQ coefficients are obtained after completing all recursions. For each set of TEQ coefficients, the received time-domain DMT sample sequence is equalized by a TEQ with the number of taps equal to the number of coefficients in that set of TEQ coefficients. The output sequence is shifted back by a fixed amount and then transformed to frequency domain via FFT. The input signal information is removed from the frequency samples, and then the IFFT is performed. The resulting time-domain sequence with a length of 2N samples yields the impulse response of the shortened channel. A sliding window with a length of (v+1) is then used to find the (v+1) most powerful consecutive samples. A shortened signal-to-noise ratio (SSNR) is then computed. The SSNR is defined as the ratio of impulse response coefficient energy within a predetermined window to that outside the window, as follows:

$$SSNR = \frac{\sum_{i=a}^{a+v} r_i^2}{\sum_{i=a}^{a-1} r_i^2 + \sum_{i=a+v+1}^{2N-1} r_i^2}$$

where a is the number of the first sample of the (v+1) most powerful consecutive samples.

After a SSNR is obtained for each set of TEQ coefficients, the set of TEQ coefficients providing the highest SSNR is selected as the final TEQ coefficients.

Thus, an embodiment of the present invention computes TEQ coefficients for each $(p-q)=(p \neq 0)$, finds the combined (shortened) channel for each such $(p-q)=x$, computes the SSNR for each such $(p-q)=x$, and selects the TEQ coefficients providing the best SSNR.

Figure 12:
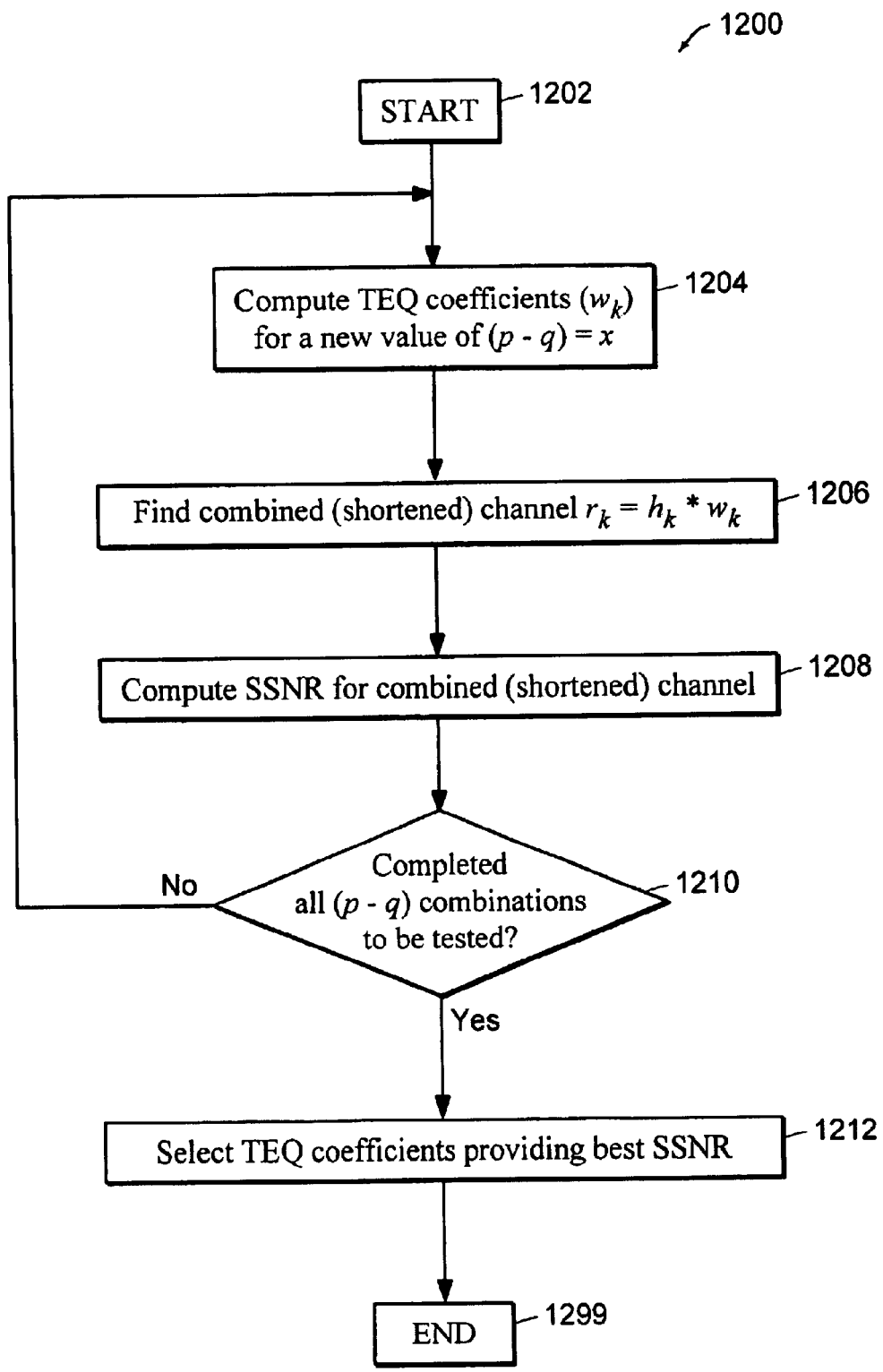
FIG. 12 is a logic flow diagram showing exemplary logic for determining TEQ coefficients in accordance with an embodiment of the present invention.

FIG. 12 is a logic flow diagram showing exemplary logic 1200 for determining TEQ coefficients using the multichannel Levinson algorithm for ARMA modeling, wherein the coefficients for a low-order model are obtained from a high-order model. Beginning at step 1202, the logic computes TEQ coefficients for a new (previously untested) value of $(p-q)=x$, in step 1204. The logic preferably does not test the case for p=0. The logic then finds the combined (shortened) channel resulting from the TEQ coefficients, in step 1206. The logic then computes the SSNR for the shortened (combined) channel, in step 1208. If the logic has completed all (p−q) combinations to be tested (YES in step 1210), then the logic selects the TEQ coefficients providing the best SSNR, in step 1212. If the logic has not completed all (p−q) combinations to be tested (NO in step 1210), then the logic recycles to step 1204 to test (p−q) combination. The logic 1200 terminates in step 1299.

When used specifically for determining TEQ coefficients for ADSL channels (as opposed to other types of communication channels), the number of searches can be reduced even further by searching only (p−q)=x for values of x>0 (i.e., p>q). This is possible because simulation results have shown that, at least for ADSL, the TEQ coefficients for values of $q \geq p$ are worse than the TEQ coefficients for values of p>q.

Figure 13:
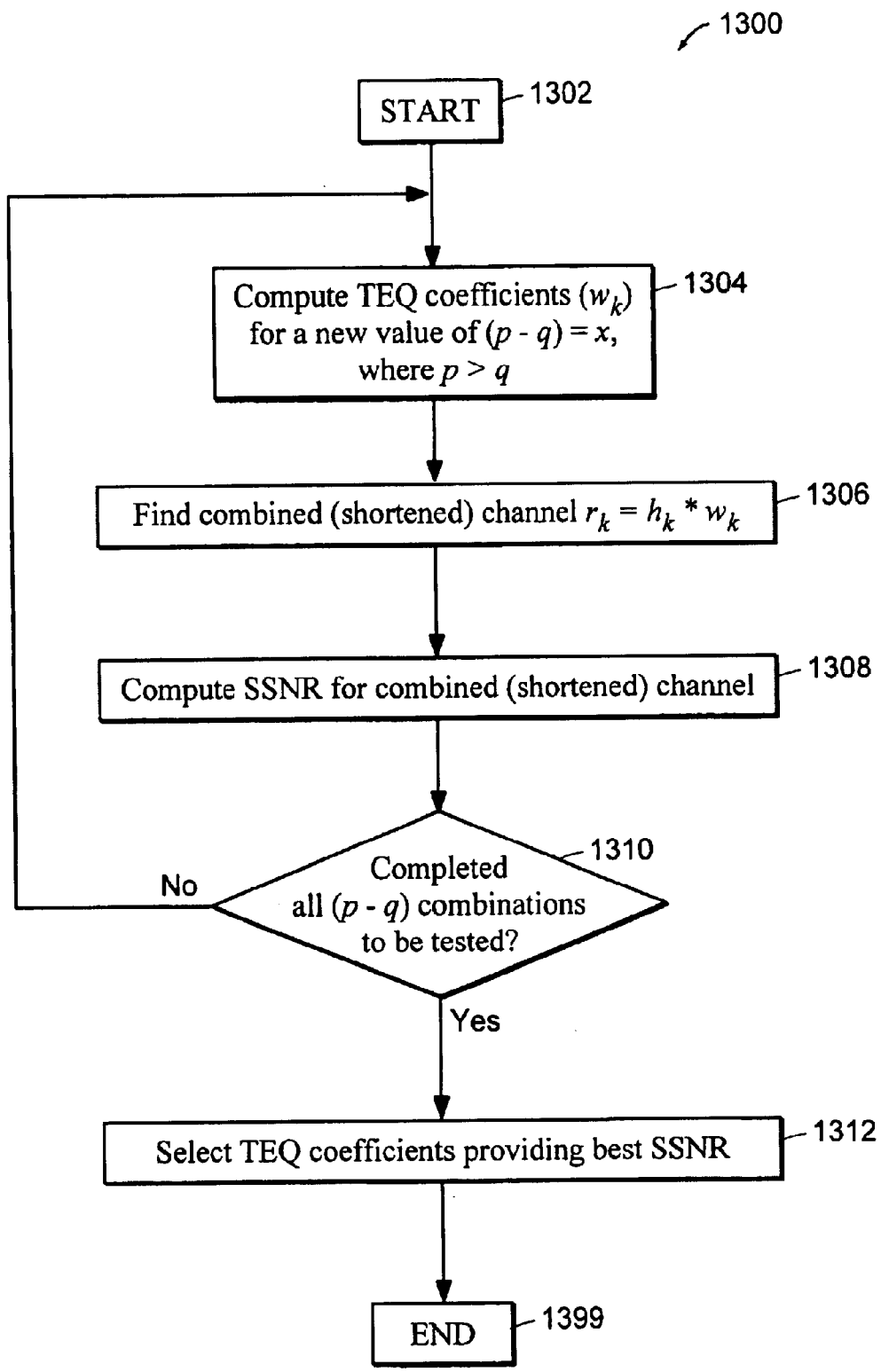
FIG. 13 is a logic flow diagram showing exemplary logic for determining TEQ coefficients in accordance with an embodiment of the present invention.

FIG. 13 is a logic flow diagram showing exemplary logic 1300 for determining TEQ coefficients using the multichannel Levinson algorithm for ARMA modeling, wherein the coefficients for a low-order model are obtained from a high-order model and wherein only combinations of (p−q) for p>q are tested. Beginning at step 1302, the logic computes TEQ coefficients for a new, previously untested, value of (p−q)=x, where p>q, in step 1304. The logic preferably does not test the case for p=0. The logic then finds the combined (shortened) channel resulting from the TEQ coefficients, in step 1306. The logic then computes the SSNR for the shortened (combined) channel, in step 1308. If the logic has completed all (p−q) combinations to be tested (YES in step 1310), then the logic selects the TEQ coefficients providing the best SSNR, in step 1312. If the logic has not completed all (p−q) combinations to be tested (NO in step 1310), then the logic recycles to step 1304 to test (p−q) combination. The logic 1300 terminates in step 1399.

The number of searches can be further reduced by searching only for $p \geq p_{min}$, where $p_{min}$ is a predetermined minimum value for p (e.g., $p \geq 8$). This is possible because, practically speaking, the model order will generally have at least the predetermined minimum number of poles, and therefore there is no need to search model orders having fewer poles.

Figure 14:
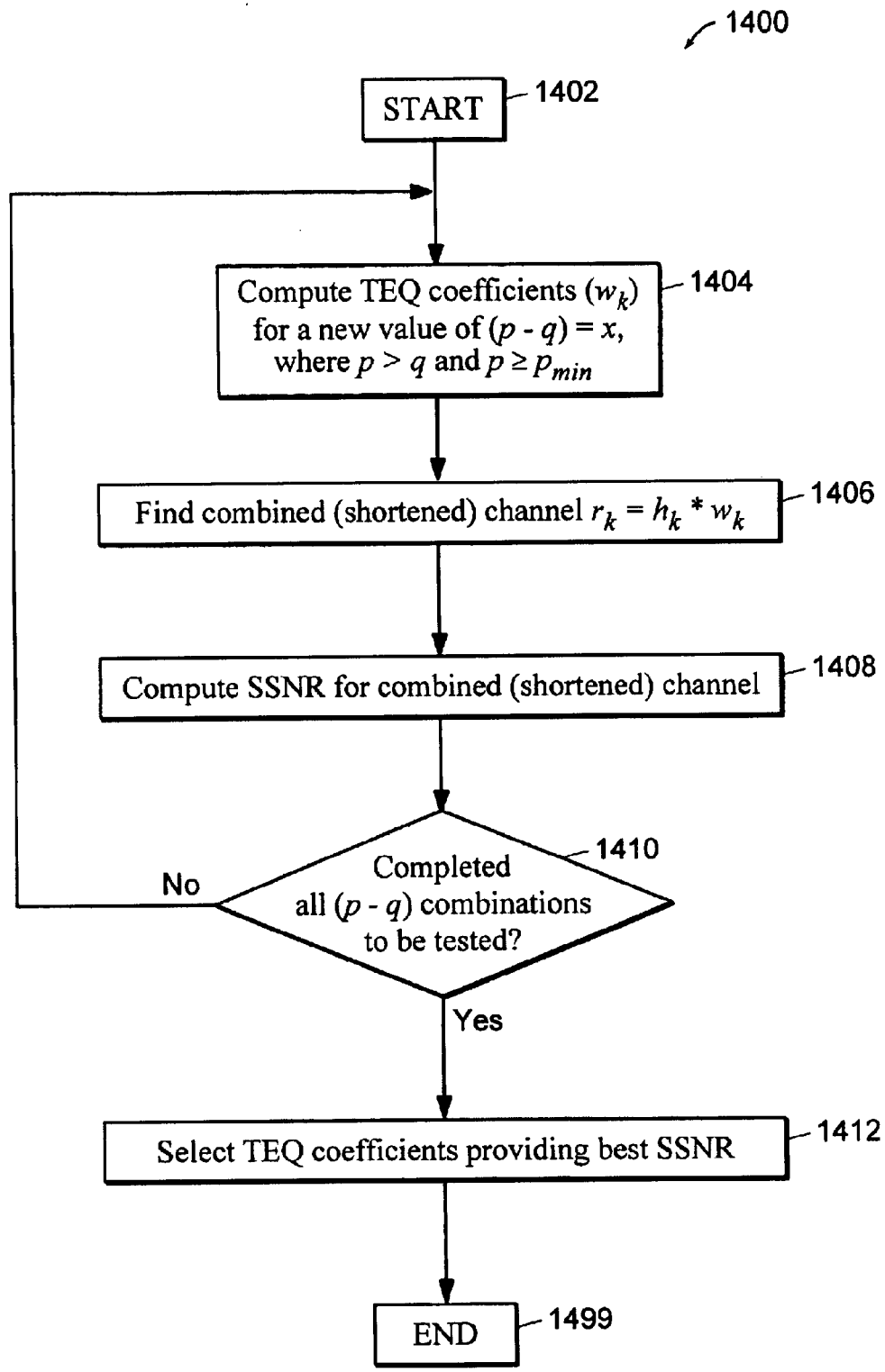
FIG. 14 is a logic flow diagram showing exemplary logic for determining TEQ coefficients in accordance with an embodiment of the present invention.

FIG. 14 is a logic flow diagram showing exemplary logic 1400 for determining TEQ coefficients using the multichannel Levinson algorithm for ARMA modeling, wherein the coefficients for a low-order model are obtained from a high-order model and wherein only combinations of (p−q) for p>q and $p \geq p_{min}$ are tested. Beginning at step 1402, the logic computes TEQ coefficients for a new, previously untested, value of (p−q)=x, where p>q and $p \geq p_{min}$, in step 1404. The logic preferably does not test the case for p=0. The logic then finds the combined (shortened) channel resulting from the TEQ coefficients, in step 1406. The logic then computes the SSNR for the shortened (combined) channel, in step 1408. If the logic has completed all (p−q) combinations to be tested (YES in step 1410), then the logic selects the TEQ coefficients providing the best SSNR, in step 1412. If the logic has not completed all (p−q) combinations to be tested (NO in step 1410), then the logic recycles to step 1404 to test (p−q) combination. The logic 1400 terminates in step 1499.

In theory, the TC-AR model is guaranteed to be stable, since the multichannel Levinson algorithm is used to estimate the model parameters [8]. In a practical implementation, however, the TC-AR model, and, equivalently, the pole-zero ARMA model, can be unstable because of numerical errors.

It can be observed from the recursions of (27) that the computations of $\alpha$, $$\Theta_{j+1}^{j+1} \text{ and } \Phi_{j+1}^{j+1},$$

are error-prone. This is because, in computing $\alpha$, successive matrix multiplications and accumulations are carried out. Small errors in the parameters obtained from the previous recursion manifest themselves into significant errors in the new recursion. The computations of $$\Theta_{j+1}^{j+1} \text{ and } \Phi_{j+1}^{j+1},$$

on the other hand, involve matrix inversion. As the diagonal entries of $\Sigma_j^f$ and $\Sigma_j^b$ become small in magnitude, inversions of these matrices yield large-value entries. Again, any small error in the original matrix results in a large error in the inverted one.

Simulations have confirmed that, with very high signal-to-noise ratio (SNR), an unstable model can be obtained with a floating-point implementation. Thus, it is desirable to detect such instabilities during recursions.

Consider the case $p \geq q$. From (11a), it can be seen that:

$$\Sigma_j^f = E[e_k e_k^T] = \begin{bmatrix} E\{e_k^{2j}\} & E\{e_k^j x_{k+\delta}\} \\ E\{x_{k+\delta} e_k^j\} & E\{x_{k+\delta}^2\} \end{bmatrix}. \tag{35}$$

The upper diagonal entry of $\Sigma_j^f$ represents the mean square error of forward prediction. As the recursion value j increases, the mean square error decreases monotonically for a stable model.

Also, (27f) can be rewritten as:

$$\Sigma_{j+1}^f = (I - \Theta_{j+1}^{j+1} \Phi_{j+1}^{j+1}) \Sigma_j^f. \tag{36}$$

From (7), it can be observed that $$\Theta_{j+1}^{j+1}$$

has non-zero entries on the first row. It can also be shown that $$\Phi_{j+1}^{j+1}$$

has non-zero entries on the first column. The product of these two matrices has a non-zero entry only at the upper diagonal location, which is the only non-zero eigenvalue of the product matrix. For convenience, this eigenvalue is denoted as $\lambda_1$. Thus, the ARMA model is stable (i.e., the pole polynomial has all its roots inside the unit circle in the z-plane or in other words, it has a minimum-phase response) if:

$$0 < \lambda_1 < 1. \tag{37}$$

Equivalently, the matrix $$(I - \Theta_{j+1}^{j+1} \Phi_{j+1}^{j+1})$$

shall be positive definite to ensure the stability of the model. Also, its eigenvalues shall not be larger than 1. Once this condition is met, it can be seen from (36) that the mean square error decreases monotonically.

Thus, in an exemplary embodiment of the invention, the training logic uses (37) to check whether or not the model is stable. Specifically, the training logic monitors the value of $\lambda_1$ during each recursion to verify that the $0 < \lambda_1 < 1$ condition is met. If the model becomes unstable during a particular recursion (i.e., the $0 < \lambda_1 < 1$ condition is not met), that recursion is terminated, since any values that would be obtained thereafter would be unreliable.

Figure 15:
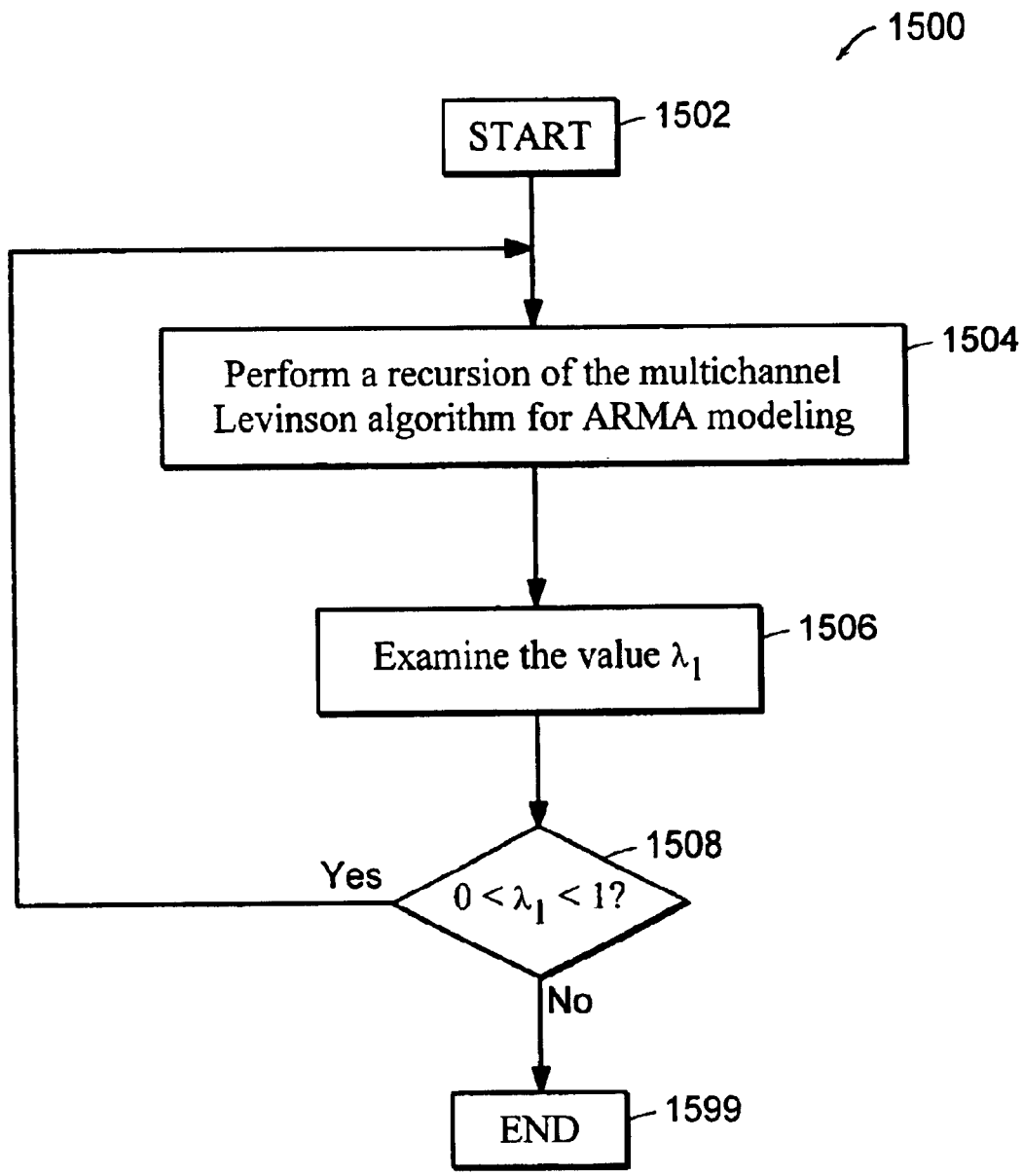
FIG. 15 is a logic flow diagram showing exemplary logic for detecting instability in accordance with an embodiment of the present invention.

FIG. 15 is a logic flow diagram showing exemplary logic 1500 for detecting instability during an iteration of the multichannel Levinson algorithm for ARMA modeling. Beginning at step 1502, the logic performs a recursion of the multichannel Levinson algorithm for ARMA modeling, in step 1504. The logic then examines the value of $\lambda_1$, in step 1506. If $0 < \lambda_1 < 1$ (YES in step 1508), then the logic recycles to step 1504 for a next recursion. Otherwise (NO in step 1508), then logic terminates the iteration. The logic 1500 terminates in step 1599.

An alternative is to add a small constant to the upper diagonal entry of $\Sigma_j^f$ whenever its value reaches a low threshold. In this way, the stability of the model can be ensured for the current recursion. Similar correction can be done to $\Sigma_j^b$. Although this correction is useful for obtaining a higher-order stable model, instability of the model with a much higher-order cannot be completely avoided. Furthermore, with the correction, the mean square error may not decrease monotonically around the correction point.

The multichannel Levinson algorithm for ARMA modeling can be expressed in a slightly different form. In this summary of the multichannel Levinson algorithm, it is assumed that the number of poles (p) is greater than the number of zeros (q), i.e. $\delta > 0$. The algorithm takes a slightly different form for cases $p = q$ and $p < q$, as will be apparent to a skilled artisan. However, since the best results are expected when $p > q$ for time-domain equalization of ADSL channels, the algorithm is not described for the $p \leq q$ cases for convenience.

The error sequence $e_k$ from (1) can be rewritten as:

$$e_k = y_k - \hat{y}_k = \sum_{i=0}^{q} b_i x_{k-i} + \sum_{i=0}^{p} a_i y_{k-i} \tag{38}$$

Introducing the following definitions:

$$u_k = \begin{bmatrix} y_k \\ x_{k-\delta} \end{bmatrix}, e_k = \begin{bmatrix} e_k \\ x_{k-\delta} \end{bmatrix}, A_i = \begin{cases} \begin{bmatrix} a_i & 0 \\ 0 & 0 \end{bmatrix} & 1 \leq i < \delta \\ \begin{bmatrix} a_i & -b_{i-\delta} \\ 0 & 0 \end{bmatrix} & \delta \leq i < p \end{cases} \tag{39}$$

where $\delta = p - q$, (38) can be rewritten as:

$$e_k = u_k - \hat{u}_k = \sum_{i=0}^{p} A_i u_{k-i}, \text{ with } A_0 = I = \begin{bmatrix} 1 & 0 \\ 0 & 1 \end{bmatrix}. \tag{40}$$

It should be noted that (40) is similar to the AR (all pole) equation except that the variables are not scalars. Now, following the procedure in deriving the recursive Levinson algorithm for the linear predictor, one can derive its multichannel (two-channel in this case) version. The following analagous variable applicable to the multichannel case are defined:

$A_i^j, i = 0, 1, \ldots, j$, $j$-th recursion forward predictor coefficients $e_k^j = \sum_{i=0}^{j} A_i^j u_{k-i}, A_0^j = I,$ $j$-th recursion forward prediction error $E_f^j = E\{e_k^j (e_k^j)^T\},$ $j$-th recursion mean square forward prediction error $B_i^j, i = 0, 1, \ldots, j$, $j$-th recursion backward predictor coefficients $w_k^j = \sum_{i=1}^{j+1} B_{j-i+1}^j u_{k-i}, B_0^j = I,$ $j$-th recursion backward prediction error $E_b^j = E\{w_k^j (w_k^j)^T\},$ $j$-th recursion mean square backward prediction error $R(i) = E\{u_k (u_k)^T\} =$ -continued $$E\left\{\begin{bmatrix} y_k y_{k-i} & y_k y_{k+\delta-i} \\ x_{k+\delta} y_{k-i} & x_{k+\delta} y_{k+\delta-i} \end{bmatrix}\right\} = \begin{bmatrix} R_{yy}(i) & R_{yx}(i-\delta) \\ R_{xy}(i+\delta) & R_{xx}(i) \end{bmatrix} = R^T(-i)$$

The multichannel Levinson algorithm can now be described as follows:

Initial conditions:

$A_0^0 = I$ $B_0^0 = I$ $E_f^0 = R(0)$ $E_b^0 = R(0)$

Algorithm, $j=0,1,\ldots,p-1$:

Using $A_i^j, B_i^j$ for $i=0,1,\ldots,j$, and $E_f^j, E_b^j$ calculate:

$$\alpha^j = \sum_{i=0}^{j} A_i^j R(j-i+1), A_0^j = I \quad (41)$$

$$\beta^j = \sum_{i=1}^{j+1} B_{j-i+1}^j R(-i), B_0^j = I$$

$$K_f^j = -\alpha^j (E_b^j)^{-1}$$

$$K_b^j = -\beta^j (E_f^j)^{-1}$$

Calculate forward and backward prediction coefficients and MS errors:

$$A_0^{j+1} = I$$

$$A_i^{j+1} = A_i^j + K_f^j B_{j-i+1}^j, i = 1, 2, \ldots, j$$

$$A_{j+1}^{j+1} = K_f^j$$

$$B_0^{j+1} = I$$

$$B_i^{j+1} = B_i^j + K_b^j A_{j-i+1}^j, i = 1, 2, \ldots, j$$

$$B_{j+1}^{j+1} = K_b^j$$

$$E_f^{j+1} = (I - K_f^j K_b^j) E_f^j$$

$$E_b^{j+1} = (I - K_b^j K_f^j) E_b^j.$$

Variables $\alpha^j$, $\beta^j$, $K_f^j$, and $K_b^j$, are only auxiliary variables. The last two variables are also known as the partial correlation coefficients. After p iterations, the model parameters are determined from the forward prediction coefficients (39).

Since the recursive procedures of the multichannel Levinson algorithm are carried out with 2×2 matrix operations, the multichannel Levinson algorithm is computationally efficient, particularly in comparison to the UTCb model. The multichannel Levinson algorithm is also robust with respect to numerical errors, and requires relatively low memory storage. However, use of the multichannel Levinson algorithm to solve the parameters of the TC-AR model implies certain compromises, as discussed throughout the remainder of the specification.

In an embodiment of the present invention, the parameters of the pole polynomial are directly applied to the TEQ, which forms a FIR filter. Specifically, the description of the ARMA model (3) can be rewritten as:

$$\hat{H}(z) = \frac{\sum_{k=0}^{q} b_k z^{-k}}{1 + \sum_{k=1}^{p} a_k z^{-k}} = \frac{B(z)}{1 + A(z)} \approx H(z) \quad (42)$$

If the TEQ, W(z), is the denominator polynomial in (42), that is:

$$W(z) = 1 + A(z) \quad (43)$$

then:

$$H(z)W(z) = H(z)[1 + A(z)] \approx \frac{B(z)}{1 + A(z)}[1 + A(z)] = B(z) \quad (44)$$

In other words, the equivalent (combined) channel made up of the original channel H(z) and the TEQ, W(z), in cascade, can be approximated by an FIR filter with the taps equal to the coefficients of the numerator polynomial, B(z). Consequently, the length of the combined channel approximately equals q, the number of zeros in the ARMA model. Therefore, if an accurate modeling is achieved with $q \leq v+1$, then ISI and ICI are avoided ether, and orthogonality between subchannels is achieved.

It should be noted from (43) that the first TEQ coefficient is always one. This provides a non-trivial solution, but offers, for the same TEQ length, fewer degrees of freedom compared to the UTCb model. For example, in the TC-AR model, there is no way to conveniently choose $\Delta$, as there is in the UTCb model. Also, with the first TEQ tap always being unity, the resulting combined impulse response, $b_k$, tends to have the bulk of its energy located around the same position as the bulk of the energy for the original channel, $h_k$. This is not always optimal, especially when the original channel impulse response is spread. For the purpose of effective modeling, the first $\Delta_1$ samples corresponding to the "flat" part of precursor were not taken into account.

Consider, for example, the upstream and downstream channels in an exemplary G.lite system that is simulated using ANSI loop #7 with G.lite transceiver filters and white background noise at −100 dBm/Hz. Even though the upstream and downstream signals occupy different frequency bands, rather sharp filtering is still required in order to completely separate upstream and downstream signals. Because the transceiver filters are considered to be part of the overall channel, the channel impulse response strongly depends upon their design. Since an upstream channel requires a steeper filter slope than a downstream channel, the total channel impulse response is more spread for the upstream channel than for the downstream channel. Consequently, a longer TEQ is used for the upstream channel than for the downstream channel (e.g., 32 taps for the downstream and 64 taps for the upstream).

Figure 16A:
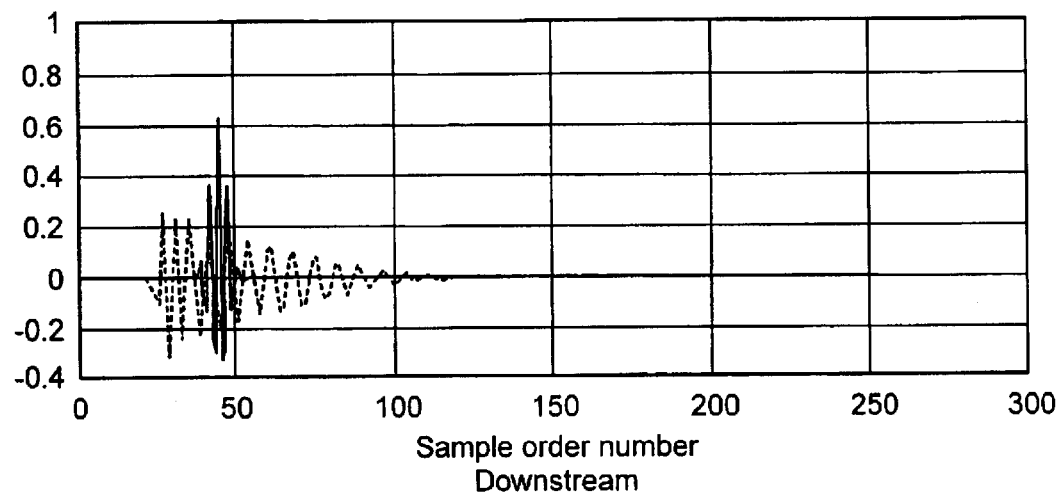
FIG. 16 shows the compressed (shortened) impulse response obtained by a reference model for simulated downstream and upstream G.lite ADSL channels.
Figure 16B:
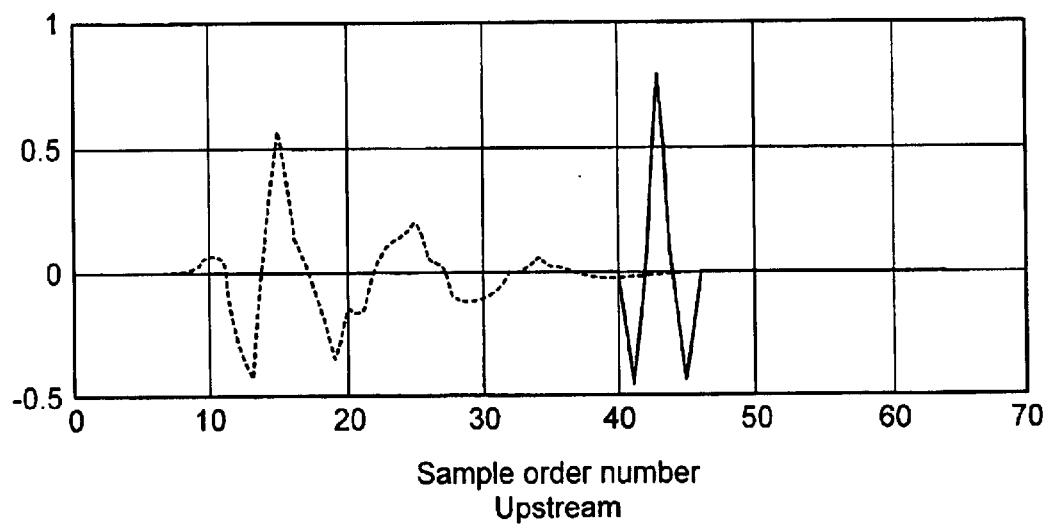

When modeled using the reference UTCb model with the heuristically found delay $\Delta_2$, the TEQ provides effective equalization for both the upstream channel and the downstream channel. FIG. 16(a) shows the compressed (shortened) impulse response obtained from the UTCb model on the simulated downstream G.lite channel, with the compressed (shortened) impulse response shown as a solid line and the original channel impulse response shown as a dotted line. FIG. 16(b) shows the compressed (shortened) impulse response obtained from the UTCb model on the simulated upstream G.lite channel, with the compressed (shortened) impulse response shown as a solid line and the original channel impulse response shown as a dotted line.

Figure 17A:
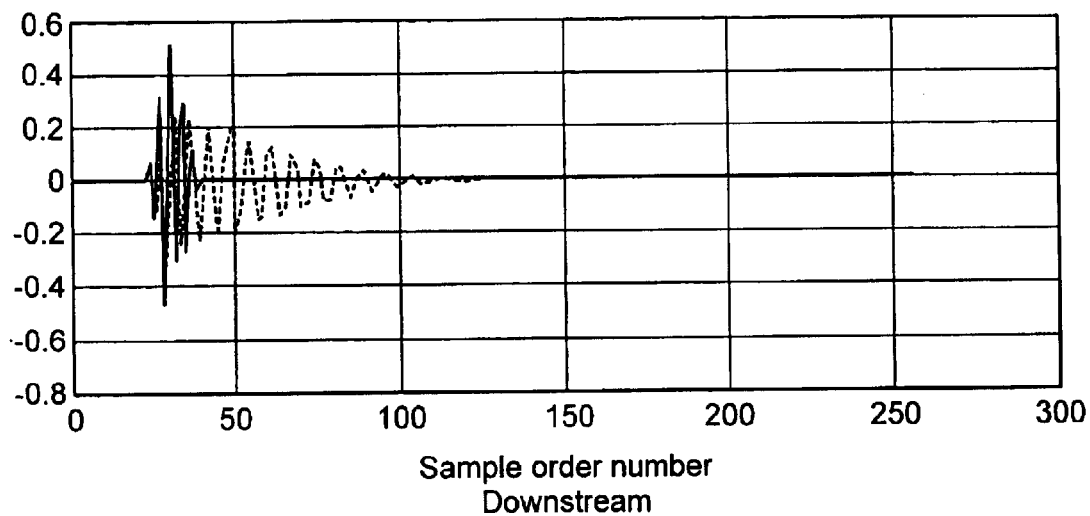
FIG. 17 shows the compressed (shortened) impulse response obtained by an auto-regressive moving average model of the present invention.
Figure 17B:
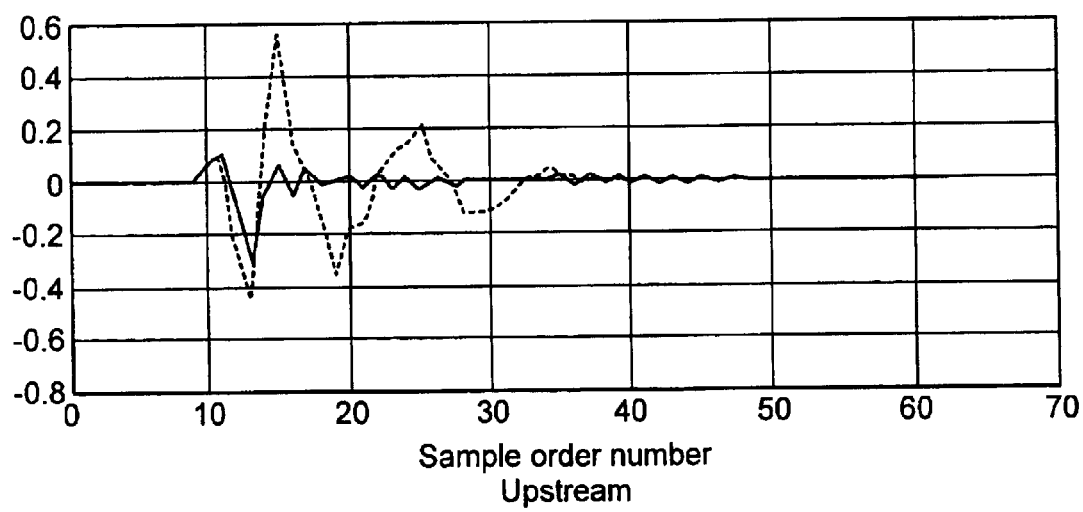

When modeled using the TC-AR model, the TEQ provides effective equalization for the downstream channel but not for the upstream channel. FIG. 17(a) shows the compressed (shortened) impulse response obtained from the TC-AR model on the simulated downstream G.lite channel, with the compressed (shortened) impulse response shown as a solid line and the original channel impulse response shown as a dotted line. FIG. 17(b) shows the compressed (shortened) impulse response obtained from the TC-AR model on the simulated upstream G.lite channel, with the compressed (shortened) impulse response shown as a solid line and the original channel impulse response shown as a dotted line.

Figure 18:
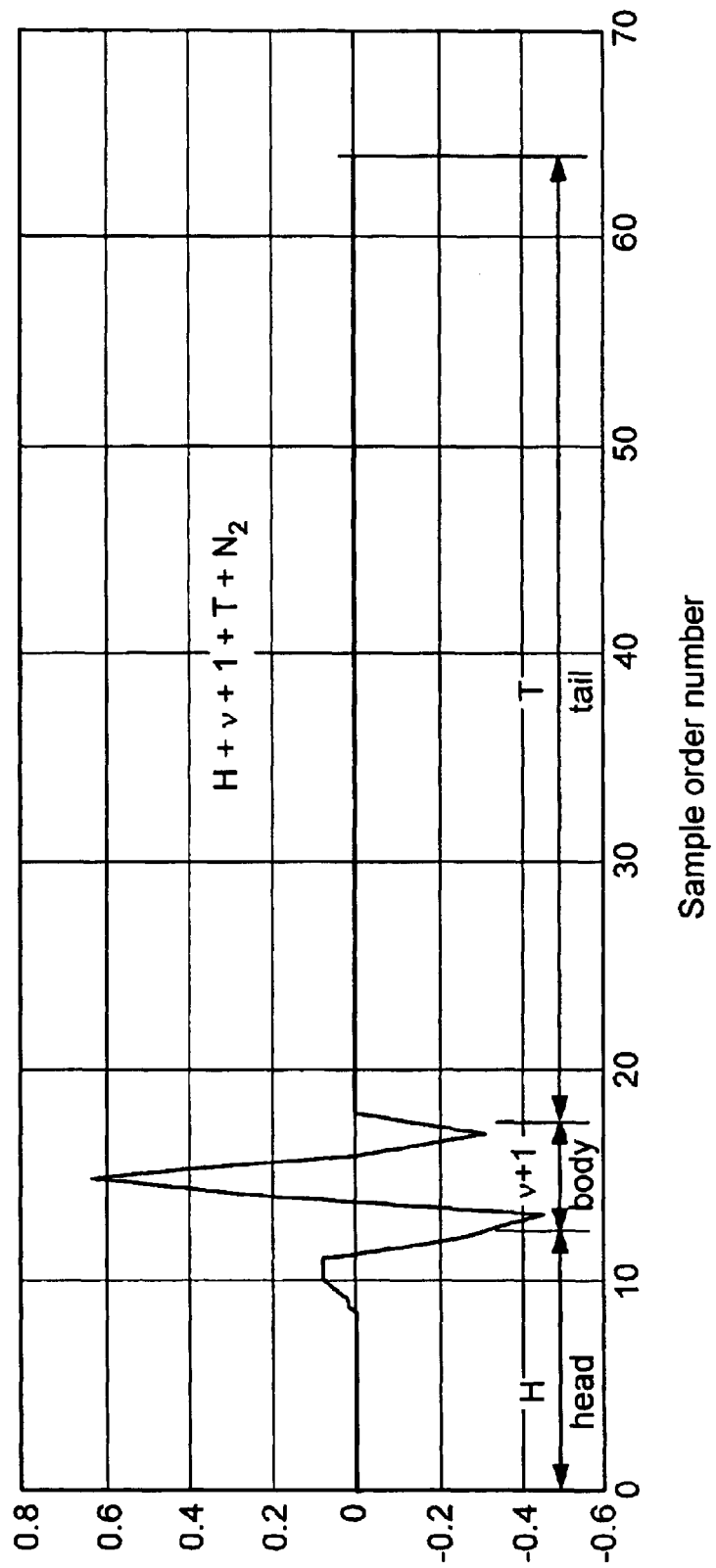
FIG. 18 shows a break-out of a channel impulse response into a head, a body, and a tail.

In order to better measure and evaluate the achieved performance of the TC-AR model, a signal-to-total-distortion ratio (STDR) is calculated. The total distortion is calculated as the sum of the combined ISI/ICI term and the noise terms, as measured at the slicer input. STDR is calculated as a function of the subcarrier order number, and is defined as follows:

$$STDR_k = \frac{S_{R,k}}{S_{I,k} + N_k}, \quad (45)$$

where $S_{R,k}$ is the receive signal discrete power spectrum, $S_{I,k}$ is the discrete power spectrum of combined ISI/ICI due to insufficient channel shortening, and $N_k$ is the discrete power spectrum of the noise component. Index k represents the subcarrier order number. It is assumed that the samples of a non-ideally shortened channel impulse response do not span more than one DMT symbol interval ($N_2$ samples). Those samples are denoted by $p_k$, and are divided into three groups:

$h = [h_0, h_1, \ldots, h_{H-1}]^T$, head,
$b = [b_0, b_1, \ldots, b_v]^T$, body (most powerful v+1 consecutive samples),
$t = [t_0, t_1, \ldots, t_{T-1}]^T$, tail,
so that:

$$p = [p_0, p_1, \ldots, p_{N_2-1}]^T = [h_0, h_1, \ldots, h_{H-1}, b_0, b_1, \ldots, b_v, t_0, t_1, \ldots, t_{T-1}]^T \quad (46)$$

with the constraint, $H+V+1+T=N_2$, as shown in FIG. 18. A rotated version of p, p', is used as well, and its definition is:

$$p' = [p'_0, p'_1, \ldots, p'_{N_2-1}]^T = [b_0, b_1, \ldots, b_v, t_0, t_1, \ldots, t_{T-1}, h_0, h_1, \ldots, h_{H-1}]^T \quad (47)$$

Then, the components of (45) are computed as follows:

$$S_{R,k} = S_X \left| \sum_{i=0}^{N_2-1} p_i e^{-j\frac{2\pi}{N_2}ik} \right|^2$$

$$S_{I,k} = \frac{2}{N_2} S_X \left[ \sum_{m=0}^{T-1} \left| \sum_{i=0}^{T-1-m} t_{i+m} e^{-j\frac{2\pi}{N_2}ik} \right|^2 + \sum_{m=0}^{H-1} \left| \sum_{i=0}^{H-1-m} h_i e^{-j\frac{2\pi}{N_2}(N_2-H+i+m)k} \right|^2 \right]$$

$$N_k = \frac{S_{N,k}}{(2L)^2} \sum_{i=-L}^{L} \left| W(e^{j\frac{\pi}{L}i}) \right|^2 \frac{\sin^2\left[\pi\left(k - \frac{N_2}{2L}i\right)\right]}{\sin^2\left[\pi\left(\frac{k}{N_2} - \frac{i}{2L}\right)\right]}$$

where, $S_X$ is the transmit (flat) power spectrum, calculated from the power spectrum density specification provided in the ADSL recommendations (−40 dBm/Hz for the downstream and −38 dBm/Hz for the upstream); $S_{N,k}=S_N$ is the discrete noise power spectrum, assumed flat for the purposes of this discussion; $W(e^{j\omega})$ is the Fourier transform of the discrete TEQ filter; 2L is the number of segments used for numerical evaluation of the integral, that was originally in the expression for $N_k$; $N_2=2N$, where N is the number of subcarriers in the observed system, as stated before.

Figure 19B:
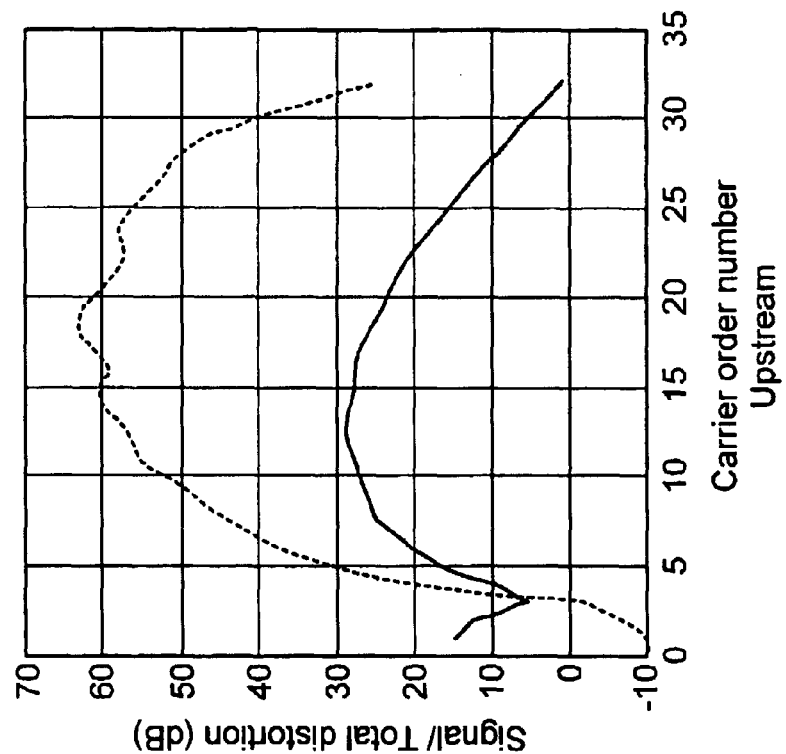
FIG. 19 shows the signal to total distortion ratio obtained from a reference model and from an auto-regressive moving average model of the present invention.
Figure 19A:
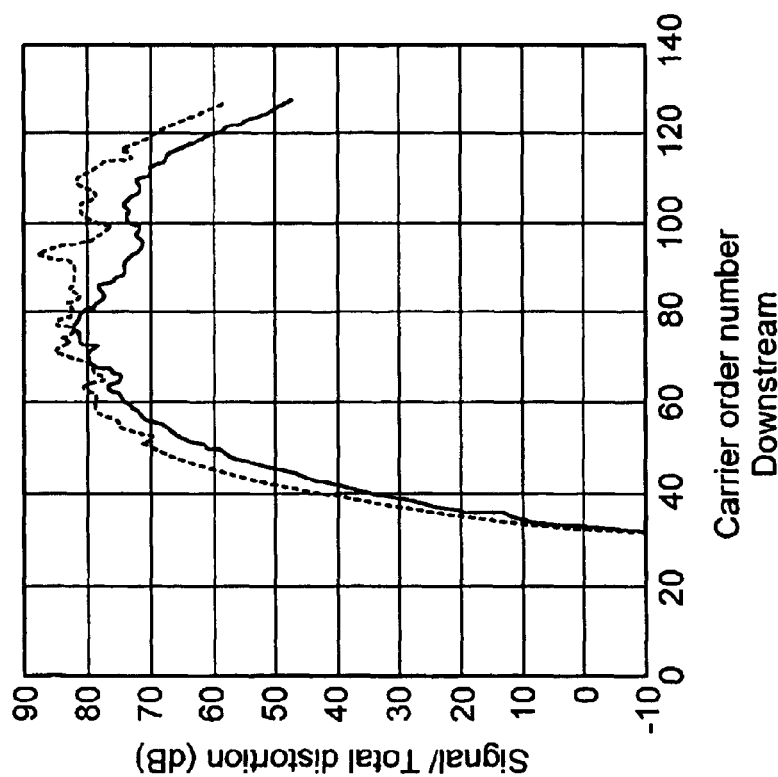

FIG. 19(a) shows the STDR obtained on the simulated downstream G.lite channel, with the STDR obtained from the TC-AR model shown as a solid line and the STDR obtained from the UTCb model shown as a dotted line. FIG. 19(b) shows the STDR obtained on the simulated upstream G.lite channel, with the STDR obtained from the TC-AR model shown as a solid line and the STDR obtained from the UTCb model shown as a dotted line.

It is clear to see from FIG. 19(b) that straight application of generalized ARMA modeling does not produce satisfactory results in the upstream case. This may be explained as a consequence of several unfavorable facts. First, the number of zeros in the model is restricted to be less than or equal to the cyclic prefix. In the case of the upstream direction, v=4, whereas in the case of the downstream, v=16 (G.lite) or v=32 (G.dmt). Therefore, the upstream channel modeling is even more restricted, and it cannot be simply compensated by increasing the number of poles. Second, modeling the upstream channel with larger spread suffers even more from lacking the possibility to model delay, Δ, associated with the optimum MSE, as is done in the UTCb model.

The related patent application entitled SYSTEM, DEVICE, AND METHOD FOR TIME-DOMAIN EQUALIZER TRAINING USING A TWO-PASS AUTO-REGRESSIVE MOVING AVERAGE MODEL, which was incorporated by reference above, extends the ARMA model of the present invention for use in equalizing the ADSL upstream channel.

Determining Optimal Sampling Time

Figure 20:
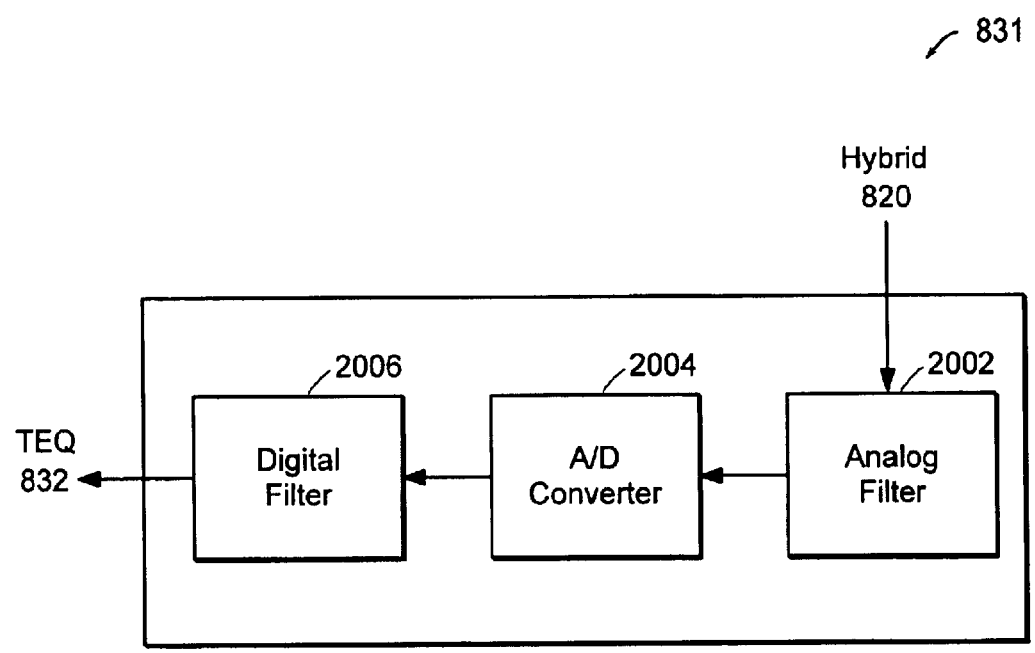
FIG. 20 is a block diagram showing the relevant logic blocks for processing the received signal and providing digitized samples to the time-domain equalizer in accordance with an embodiment of the present invention.

FIG. 20 shows the relevant logic blocks of the block 831 shown in FIG. 8. Among other things, the block 831 provides digitized samples to the TEQ 832 at the Nyquist rate, $f_s$, which is determined by the type of ADSL channel (2.208 MHz for G.dmt downstream channel, 1.1.4 MHz for G.lite downstream channel, and 276 KHz for upstream channel). The block 831 includes, among other things, analog filter 2002, analog-to-digital (A/D) converter 2004, and digital filter 2006. The analog signal received via the hybrid 820 is filtered by analog filter 2002, and is then converted to a sequence of digital samples by A/D converter 2004. The A/D converter typically over-samples the received signal at a predetermined multiple N times the Nyquist rate (i.e., N*$f_s$). The digital filter 2006 filters the over-sampled sequence received from the A/D converter 2004, and performs a decimation function to provide a sequence of samples to the TEQ 832 at the Nyquist rate $f_s$. For example, the digital filter may output every Nth filtered sample to the TEQ 832. In other words, the over-sampled sequence includes N separate Nyquist rate sequences, each consisting of every Nth filtered sample starting from a different offset (delay) within the over-sampled sequence. The digital filter 2006 outputs one of the Nyquist rate sequences.

Unfortunately, the Nyquist rate sequence output by the digital filter 2006 may not be the optimal Nyquist rate from among the N separate Nyquist rate sequences. Therefore, an embodiment of the present invention determines the best Nyquist rate sequence from among the N separate Nyquist rate sequences, and configures a delay in the digital filter 2006 so that the best Nyquist rate sequence is provided to the TEQ 832.

Specifically, the over-sampled sequence is divided into the N separate Nyquist rate sequences, and an initial test sequence from among the N separate Nyquist rate sequences is selected. TEQ coefficients are determined based upon the initial test sequence, and the resulting shortened channel impulse response is measured, preferably by calculating SSNR. Then, the shortened channel impulse response for each of the remaining Nyquist rate sequences is measured, and the Nyquist rate sequence providing the best performance (i.e., the highest SSNR) is selected. The delay is configured so that the selected Nyquist rate sequence is provided to the TEQ 832.

Figure 21:
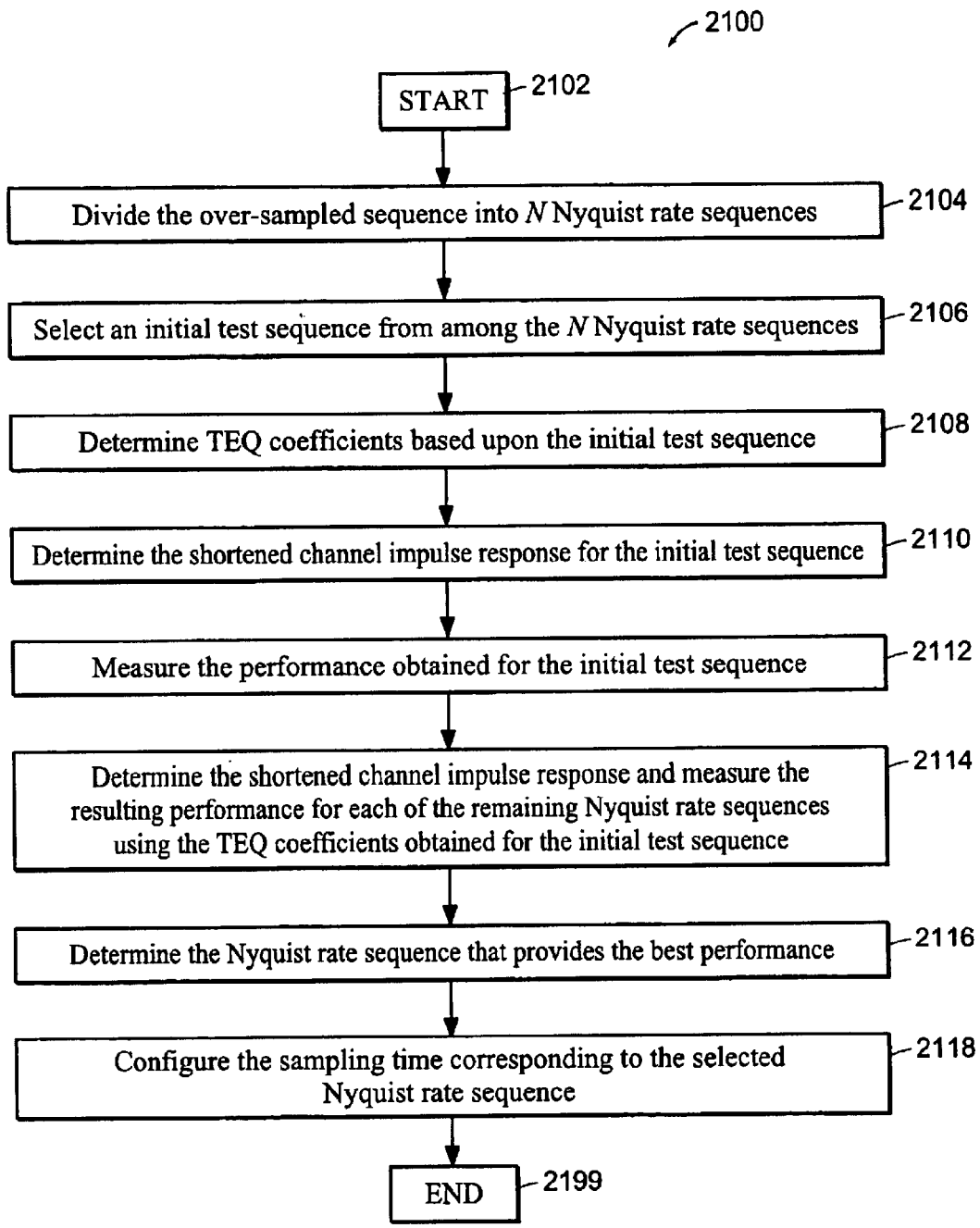
FIG. 21 is a logic flow diagram showing exemplary logic for determining the sampling time for the time-domain equalizer.

FIG. 21 is a logic flow diagram showing exemplary logic 2100 for determining the sample time for the TEQ. Beginning at step 2102, the logic divides the over-sampled sequence into N Nyquist rate sequences, in step 2104. The logic then selects an initial test sequence from among the N Nyquist rate sequences, in step 2106. The logic then determines TEQ coefficients based upon the initial test sequence, in step 2108, determines the shortened channel impulse response for the initial test sequence, in step 2110, and measures the performance obtained for the initial test sequence, in step 2112, preferably by calculating the SSNR. The logic then proceeds to determine the shortened channel impulse response and measure the resulting performance for each of the remaining Nyquist rate sequences, in step 2114, using the TEQ coefficients obtained for the initial test sequence. The logic determines the Nyquist rate sequence that provides the best performance, in step 2116, and configures the sampling time corresponding to the selected Nyquist rate sequence, in step 2118. The logic terminates in step 2199.

Described another way, an initial delay is determined for the received time-domain sequence, where the initial delay is based upon:

$$\Delta_i = arg \left\{ \max_{i \in [0, N_s-1]} \max_{l \in [0, L-1]} \left| \sum_{k=0}^{2N-1} r(i + N_s(k+l))x(k) \right|^2 \right\} \quad (48)$$

where L is a pre-selected window that accounts for the overall transmission delay of the transceiver.

The criterion of (48) is then used to select a sample point at which the received time-domain DMT symbol maximally matches the input symbol. This is equivalent in principle to sampling the signal at the maximum eye-opening for a matched-filter receiver. For the ADSL modem, however, this sample point is not optimum because ISI is not minimized and therefore maximum throughput may not be achieved.

To correct this problem, the TEQ output sequence is first shifted by a fixed amount, for example, $\Delta_{shift}=(v/2+3)$, where the delay introduced by the target channel is assumed to be approximately v/2, and 3 is added to allow the search window shifted slightly in the advance direction. The purpose of this shifting is to avoid wraparound operation. Then FFT is taken for the shifted TEQ output sequence and the shortened channel impulse response is obtained. For the shortened impulse response, SSNR is computed and the sliding window position is determined. Assuming $\Delta_{offset}$ denotes the offset of the window from the beginning of the sequence, then the final delay is determined as:

$$\Delta = \Delta_i - \Delta_{shift} + \Delta_{offset}. \quad (49)$$

In this way, the ISI in the TEQ output sequence is minimized, and maximum throughput is achieved.

Alternative Embodiments

In an exemplary embodiment of the present invention, the training logic including the logic for determining the sampling time for the TEQ is implemented predominantly as programmed logic that is stored in a computer readable medium and executed by a Digital Signal Processor (DSP) or other processor within the ATU. The programmed logic may be implemented in any of a number of programming languages. The programmed logic may be fixed in a tangible medium, such as a computer readable medium (e.g., a diskette, CD-ROM, ROM, or fixed disk), or fixed in a computer data signal embodied in a carrier wave that is transmittable to a computer system via a model or other interface device, such as a communications adapter connected to a network over a medium. The medium may be a tangible medium (e.g., analog, digital, or optical communication lines) or a medium implemented with wireless techniques (e.g., microwave, infrared, or other transmission techniques). The programmed logic embodies all or part of the functionality previously described herein with respect to the system.

Alternative embodiments of the invention may be implemented using discrete components, integrated circuitry, programmable logic used in conjunction with a programmable logic device such as a Field Programmable Gate Array (FPGA) or microprocessor, or any other means including any combination thereof.

The present invention may be embodied in other specific forms without departing from the essence or essential characteristics. The described embodiments are to be considered in all respects only as illustrative and not restrictive.

We claim:

1. A method for determining a sampling time for a time-domain equalizer, the method comprising:
    dividing an over-sampled sequence into a plurality of individual Nyquist rate sequences;
    determining time-domain equalizer coefficients using one of the individual Nyquist rate sequences;
    measuring a performance for each of the individual Nyquist rate sequences using the time-domain equalizer coefficients;
    selecting the Nyquist rate sequence having the best performance; and
    configuring the sampling time so that the selected Nyquist rate sequence is provided to the time-domain equalizer.

2. The method of claim 1, wherein measuring a performance for each of the individual Nyquist rate sequences using the time-domain equalizer coefficients comprises calculating a shortened signal-to-noise ratio for each of the individual Nyquist rate sequences.

3. The method of claim 2, wherein selecting the Nyquist rate sequence having the best performance comprises selecting the Nyquist rate sequence associated with the highest shortened signal-to-noise ratio.

4. The method of claim 1, wherein configuring the sampling time so that the selected Nyquist rate sequence is provided to the time-domain equalizer comprises configuring a delaying a digital filter so that the digital filter provides the selected Nyquist rate sequence to the time-domain equalizer.

5. A program product for determining a sampling time for a time-domain equalizer, the program product comprising:
    logic for dividing an over-sampled sequence into a plurality of individual Nyquist rate sequences;
    logic for determining time-domain equalizer coefficients using one of the individual Nyquist rate sequences;
    logic for measuring a performance for each of the individual Nyquist rate sequences using the time-domain equalizer coefficients;

logic for selecting the Nyquist rate sequence having the best performance; and logic for configuring the sampling time so that the selected Nyquist rate sequence is provided to the time-domain equalizer.

6. A communication system comprising a first communication device in communication with a second communication device over a communication channel, wherein the first communication device is operably coupled to transmit a training signal to the second communication device over the communication channel, and wherein the second communication device is operably coupled to receive the training signal over the communication channel, over-sample the received signal at a predetermined multiple N times a predetermined Nyquist rate, divide the over-sampled sequence into a plurality of individual Nyquist rate sequences, determine time-domain equalizer coefficients using one of the individual Nyquist rate sequences, measure a performance for each of the individual Nyquist rate sequences using the time-domain equalizer coefficients, select the Nyquist rate sequence having the best performance, and configure the sampling time so that the selected Nyquist rate sequence is provided to a time-domain equalizer.

* * * * *